(12) United States Patent
Takenaka

(10) Patent No.: US 7,646,464 B2
(45) Date of Patent: Jan. 12, 2010

(54) DISPLAY DEVICE AND INSPECTION METHOD OF POSITION GAP

(75) Inventor: Yuuichi Takenaka, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 646 days.

(21) Appl. No.: 11/451,348

(22) Filed: Jun. 13, 2006

(65) Prior Publication Data
US 2006/0284821 A1    Dec. 21, 2006

(30) Foreign Application Priority Data
Jun. 17, 2005   (JP)   ............... 2005-177439

(51) Int. Cl.
*G02F 1/1345* (2006.01)
(52) U.S. Cl. ..................... 349/150; 349/152
(58) Field of Classification Search ......... 349/149–150, 349/152
See application file for complete search history.

(56) References Cited

U.S. PATENT DOCUMENTS 5,757,450 A * 5/1998 Fujii et al. ............... 349/106
5,982,470 A * 11/1999 Nakahara et al. ............ 349/153
6,172,732 B1 * 1/2001 Hayakawa et al. .......... 349/152

FOREIGN PATENT DOCUMENTS

JP    5-241178    2/1992
JP    9-5381    6/1995

OTHER PUBLICATIONS

Office Action from Chinese Patent Office dated Sep. 26, 2008 regarding Chinese Patent Application No. 200610092264X, in Chinese.

* cited by examiner

*Primary Examiner*—James A Dudek
(74) *Attorney, Agent, or Firm*—Stites & Harbison PLLC; Juan Carlos A. Marquez, Esq.

(57) ABSTRACT

The present invention can easily inspect the connection between a flexible printed circuit board and terminals. In a display device which includes a display panel which forms a plurality of lines as first lines on a terminal portion thereof, and a film-like substrate which forms a plurality of lines as second lines thereon, the display panel has a determination terminal which is arranged close to the terminal portion, has a width larger than a width of the terminal, and has a portion thereof removed, the film-like substrate forms third lines and fourth lines arranged close to the second lines thereon, the third lines face the determination terminal, and the fourth lines face the removed portion of the determination terminal from which the portion is removed.

8 Claims, 10 Drawing Sheets

DISPLAY DEVICE AND INSPECTION METHOD OF POSITION GAP

BACKGROUND OF THE INVENTION

1. Field of the Invention

The present invention relates to a display device and an inspection method of a position gap, and more particularly to a technique which is effectively applicable to a display device which includes a liquid crystal display panel and a driver IC for driving the liquid crystal display panel.

2. Description of Related Art

Conventionally, as a display device, there has been known a display device which includes a liquid crystal display panel (hereinafter referred to as a liquid crystal display device)

The liquid crystal display panel is, for example, a display panel which seals a liquid crystal material between two substrates which form lines for an image display on transparent substrates such as glass substrates. Here, on one substrate out of these two substrates, for example, elements such as TFTs which apply a voltage to the liquid crystal material are arranged in an array, and color filters and the like are mounted on another substrate.

In assembling the liquid crystal display device, for example, a printed circuit board is arranged on a periphery of the liquid crystal display panel. Then, lines of the printed circuit board and lines of the display panel are connected with lines which are formed on a flexible printed circuit board such as a tape carrier package (TCP), a chip on film (COF) or the like thus establishing an electrical connection with a driver IC for driving the liquid crystal display panel.

As a connection method of the lines of the flexible printed circuit board and the lines of the printed circuit board and a connection method of the lines of the flexible printed circuit board and the lines of the liquid crystal display panel, there has been known a method which performs such a connection using an anisotropic conductive film (ACF).

With respect to the liquid crystal display panel, the large sizing and the higher definition are in progress recently. Accordingly, a pitch between terminals of the liquid crystal display panel is made smaller and hence, in electrically connecting the lines of the liquid crystal display panel and the lines of the flexible printed circuit board, the high positioning accuracy is required.

Accordingly, a connection defect (open defect) attributed to a position gap or short-circuiting defect is liable to be easily generated.

Accordingly, the inspection of the total number of position gaps becomes necessary and hence, there exists a demand for a technique which can facilitate such an inspection.

With respect to the inspection of such position gaps, there has been proposed a method in which an inspection terminal is provided to a liquid crystal display panel side, an inspection lead is provided to a driver IC side, lines are connected with each other, and the electrical conduction between the inspection terminal and the inspection lead is inspected thus determining whether a connection defect attributed to a position gap is generated or not (for example, see Japanese Patent Laid-open Hei 9(1997)-5381 (hereinafter referred to as "patent document 1").

SUMMARY OF THE INVENTION

The conventional method described in the patent document 1 or the like is a detection method which detects only the connection defect in the direction along which the connection terminal portions of the lines are arranged, that is, only the connection defect attributed to the position gap in the width direction of the lines.

However, in connecting the lines of the liquid crystal display panel and the lines of the driver IC, the position gaps are generated not only in the line width direction but also in various directions. In connecting these lines, when the position gap is generated in the direction perpendicular to the line width, for example, there arises a possibility of the generation of conductive defect attributed to the increase or the decrease of a connection area, for example. However, the conventional inspection method has a drawback that the method cannot determine whether such a defect is generated or not.

Further, the lines of the liquid crystal display panel have distal end of terminal regions for connection usually bent in the neighboring lines side. Accordingly, when the position gap is generated in the direction perpendicular to the line width and a quantity of position gap is large, along an extension in the direction perpendicular to the line width of the driver IC, the line of the driver IC becomes conductive with the line arranged close to a preset line of the liquid crystal display panel thus giving rise to a possibility of short-circuiting. However, the above-mentioned inspection method cannot determine the generation of such a defect.

Accordingly, for example, even when a method which determines whether a connection defect attributed to a position gap is generated or not is applied to the inspection method described in the patent document 1, there may be a case that, in performing the inspection of the operation of the liquid crystal display panel, the inspection of the operation is performed with respect to the liquid crystal display panel on which the connection defect or the short-circuiting defect is generated and hence, there has been a drawback that the operability of the inspection of the operation of the liquid crystal display panel is not always improved.

Further, also in connecting the lines of the printed circuit board and the lines of the flexible printed circuit board, the high positional accuracy is demanded although a level of the demanded positional accuracy may be lower than the positional accuracy required in the connection of the lines of the liquid crystal display panel and the lines of the flexible printed circuit board. Accordingly, there may be a case that a position gap is generated in such a connection operation.

It is an object of the present invention to provide a technique which can facilitate the determination of a connection defect or a short-circuiting defect attributed to a position gap when lines of a liquid crystal display panel and lines of a flexible printed circuit board are connected with each other.

It is another object of the present invention to provide a technique which can facilitate the determination of a connection defect or a short-circuiting defect attributed to a position gap when lines of a printed circuit board and lines of a flexible printed circuit board are connected with each other.

It is still another object of the present invention to provide a technique which can enhance the operability of the inspection of an operation of a liquid crystal display panel.

The above-mentioned object and other objects and novel features of the present invention will become apparent in conjunction with the description of this specification and attached drawings.

To briefly explain the schematic constitution of the present invention disclosed in this specification, they are as follows.

(1) The present invention is directed to a display device which includes a display panel which forms a plurality of lines (hereinafter referred to as "first lines") for an image display on a surface of a substrate thereof, a film-like substrate which forms a plurality of lines (hereinafter referred to as "second lines") on a surface of a film-like insulation substrate thereof, and a printed circuit board which includes lines which are electrically connected with the first lines via the second lines, wherein the display panel includes a conductive determination terminal for determining a position gap at the time of electrically connecting the first lines and the second lines, the film-like substrate includes determination potential supply lines which are electrically connected with the determination terminal and position gap detection lines which are arranged close to the determination potential supply lines and are electrically insulated from the respective first lines and the determination terminal, and the determination terminal of the display panel include a determination part which determines a position gap in the arrangement direction of the position gap detection lines and the determination potential supply lines and a position gap in the direction perpendicular to the arrangement direction.

(2) The display device is also characterized in that, in the above-mentioned means (1), the position gap detection line of the film-like substrate have a region where a line width is partially made large within a region thereof which is overlapped to the display panel in plane, and the determination part of the determination terminal of the display panel is a discontinuous annular shape which surrounds the region of the position gap detection line where the line width is made large in plane.

(3) The display device is also characterized in that, in the means (1) or the means (2), the determination terminal of the display panel is electrically independently arranged from the respective first lines.

(4) The display device is also characterized in that, in the means (1) or the means (2), the determination terminal of the display panel is provided to an end portion of any one of the respective first lines.

(5) The display device is also characterized in that, in any one of the means (1) to the means (4), the determination potential supply line of the film-like substrate and the position gap detection line are electrically connected with the lines formed on the printed circuit board.

(6) The display device is also characterized in that, in the means (5), a plurality of film-like substrates are provided, and among the lines which are formed on the printed circuit board, the line which is electrically connected with the determination potential supply line or position gap detection lines of the respective film-like substrate is formed of a common line.

(7) The display device is also characterized in that, in any one of the means (1) to the means (6), a semiconductor chip is mounted on the film-like substrate.

(8) The present invention is directed to a display device which includes a display panel which forms a plurality of lines (hereinafter referred to as "first lines") for an image display on a surface of a substrate thereof, a film-like substrate which forms a plurality of lines (hereinafter referred to as "second lines") on a surface of a film-like insulation substrate thereof, and a printed circuit board which includes lines (hereinafter referred to as "third lines") which are electrically connected with the first lines via the second lines, wherein the film-like substrate includes a conductive determination terminal for determining a position gap at the time of electrically connecting the third lines and the second lines, the printed circuit board includes a determination potential supply line which is electrically connected with the determination terminal and a position gap detection terminal which is electrically insulated from the third line and the detection potential supply line, and the determination terminal of the film-like substrate includes a determination part which determines a position gap in the arrangement direction of the position gap detection line and the determination potential supply line and a position gap in the direction perpendicular to the arrangement direction.

(9) The display device is also characterized in that, in the means (8), the determination part of the determination terminal of the film-like substrate is formed in an annular shape which surrounds the position gap detection terminal in plane, the printed circuit board has two or more line layers on a surface and in the inside of an insulation substrate, and the position gap detection terminal is electrically connected with lines which are formed on an outer region of the determination part by way of the line layers formed in the inside of the insulation substrate.

(10) The display device is also characterized in that, in the means (8) or the means (9), the determination potential supply line of the printed circuit board is electrically independently arranged from the respective third lines.

(11) The display device is also characterized in that, in the means (8) or the means (9), the determination potential supply line of the printed circuit board is used in common with any one of the respective third lines.

(12) The display device is also characterized in that, in any one of the means (8) to the means (11), a plurality of film-like substrates is provided, and among the lines which are formed on the printed circuit board, the line which is electrically connected with the determination potential supply line or position gap detection terminal of the respective film-like substrates is formed of a common line.

(13) The display device is also characterized in that, in any one of the means (8) to the means (12), step-like notches are formed in a connection portion between the second line and the third line or a connection portion between the determination terminal of the film-like substrate and the determination potential supply line of the printed circuit board.

(14) The display device is also characterized in that, in the means (13), the step-like notch is formed in two sides of the second line or the determination terminal which face each other in an opposed manner.

(15) The display device is also characterized in that, in any one of the means (8) to the means (14), the display panel includes a conductive determination terminal for determining a position gap at the time of electrically connecting the first lines and the second lines, the film-like substrate includes a determination potential supply line which is electrically connected with the determination terminal of the display panel and a position gap detection line which is arranged close to the determination potential supply line and is electrically insulated from the respective first lines and the determination terminal, and the determination terminal of the display panel includes a determination part which determines a position gap in the arrangement direction of the position gap detection line and the determination potential supply line of the film-like substrate and a position gap in the direction perpendicular to the arrangement direction.

(16) The display device is also characterized in that, in the means (15), the position gap detection line of the film-like substrate has a region where a line width is partially made large within a region thereof which is overlapped to the display panel in plane, and the determination part of the determination terminal of the display panel is a discontinuous annular shape which surrounds the region of the position gap detection line of the film-like substrate where the line width is made large in plane.

(17) The display device is also characterized in that, in the means (15) or the means (16), the determination terminal of the display panel is electrically independently arranged from the respective first lines.

(18) The display device is also characterized in that, in the means (15) or the means (16), the determination terminal of the display panel is provided to an end portion of any one of the respective first lines.

(19) The display device is also characterized in that, in any one of the means (15) to (18), the determination terminal of the film-like substrate is formed on an end portion of the determination potential supply line of the film-like substrate.

(20) The display device is also characterized in that, in any one of the means (15) to (19), the printed circuit board has the position gap detection terminal thereof electrically connected to the surface of the insulation substrate, a conductor terminal is provided on an outer region of the determination part of the determination terminal of the film-like substrate, and the position gap detection line of the film-like substrate is electrically connected with the conductor terminal of the printed circuit board.

(21) The display device is also characterized in that, in any one of the means (6) to (17), a semiconductor chip is mounted on the film-like substrate.

(22) The display device is also characterized in that, in any one of the means (1) to (21), the display panel is a liquid crystal display panel.

(23) A position gap inspection method which, in electrically connecting a plurality of lines (hereinafter referred to as "first lines") which is formed on a display panel and a plurality of lines (hereinafter referred to as "second lines") which is formed on a film-like substrate with each other, inspects a position gap between the first line and the second line, wherein two electrically independent lines consisting of a determination potential supply line and a position gap detection line are formed on the film-like substrate, and a conductive determination terminal having a determination part which is electrically connected with the determination potential supply line and determines a position gap in the arrangement direction of the position gap detection line and the determination potential supply line and a position gap in the direction perpendicular to the arrangement direction is formed on the display panel, and after electrically connecting the first lines and the second lines, a conduction inspection between the determination potential supply line and the position gap detection line on the film-like substrate is performed.

(24) A position gap inspection method which, in electrically connecting a plurality of lines (hereinafter referred to as "third lines") which are formed on a printed circuit board and a plurality of lines (hereinafter referred to as "second lines") which are formed on a surface of a film-like substrate with each other, inspects a position gap between the third line and the second line, wherein two electrically independent line terminals consisting of a determination potential supply line and a position gap detection terminal are formed on the printed circuit board, and a conductive determination line or determination terminal having a determination part which determines a position gap in the arrangement direction of the position gap detection terminal and the determination potential supply line and a position gap in the direction perpendicular to the arrangement direction is formed on a surface of the film-like substrate, and after electrically connecting the third lines and the second lines, a conduction inspection between the determination potential supply line and the position gap detection line on the film-like substrate is performed.

Further, to extract particularly important portions out of the means (1) to (24), they are as follows.

(25) A display device which includes a display panel which forms a plurality of lines as first lines on a terminal portion thereof and a film-like substrate on which a plurality of lines are formed as second lines, wherein the display panel includes a determination terminal which is arranged close to the terminal portion, sets a width thereof larger than the terminal and has a portion thereof eliminated, the display panel includes third lines and fourth lines which are arranged close to the second lines on the film-like substrate, the third lines face the determination terminal in an opposed manner, and the fourth lines face the eliminated portion of the determination terminal.

(26) The display device is also characterized in that, in the means (25), when the fourth lines are displaced exceeding the eliminated portion of the determination terminal, a position gap is detected in response to a state that the third lines and the fourth lines assume the same potential.

(27) The display device is also characterized in that, in the means (25) or the means (26), a removal shape of the determination terminal is capable of determining both of a position gap in the direction that the plurality of first lines is arranged in parallel to each other and a position gap in another direction perpendicular to the direction.

(28) The display device is also characterized in that, in any one of the means (25) to (27), the third lines and the fourth lines are electrically connected with lines formed on a printed circuit board.

In the display device of the present invention, as in the case of the means (1), the determination terminal is formed on the display panel and the determination potential supply line and the position gap detection terminal are formed on the film-like substrate and hence, the determination terminal and the determination potential supply line are electrically connected with each other. Due to such a means, in a step for assembling the display device, after electrically connecting the first lines of the display panel and the second lines of the film-like substrate, the conduction between the determination potential supply line and the position gap detection line is inspected whereby the position gap between the first line and the second line can be easily detected. Accordingly, immediately after the electrical connection between the first lines and the second lines, it is possible to inspect a connection defection or a short-circuiting defection between the first lines and the second lines whereby when each defect is generated, the display device is removed as a defective product.

Further, when the determination terminal of the display panel is, as in the case of the means (1), configured to include the determination part which determines a position gap in the arrangement direction of the position gap detection line and the determination potential supply line on the film-like substrate and the position gap in the direction perpendicular to the arrangement direction, for example, compared to the inspection described in patent document 1 which inspects only the a position gap in the arrangement direction of the position gap detection line and the determination potential supply line on the film-like substrate, the inspection accuracy of the connection defect or the short-circuiting defect of the first lines and second lines can be enhanced. As a result, in performing the inspection of the operation of the display panels, it is possible to inspect only the display panels which are free from the respective defects and hence, the operability of the inspection of the operation of the display panels can be enhanced.

Here, as in the case of the means (2), it is preferable that the position gap detection line of the film-like substrate has the region where the line width is made large, and the determination part of the determination terminal of the display panel is formed in the discontinuous annular shape which surrounds the region of the position gap detection line where the line width is made large in plane. Due to such a means, for example, with respect to the position gaps in the directions perpendicular to the arrangement direction of the position gap detection line and the determination potential supply line on the film-like substrate, that is, with respect to the position gap in the extending direction of the respective lines, it is possible to determine the position gap in the extending direction of the position gap detection line and the position gaps in the directions opposite to such directions. Further, by forming the determination part of the determination terminal of the display panel in the discontinuous annular shape, even when not only the a position gap in the arrangement direction of the position gap detection line and the determination potential supply line of the film-like substrate and the position gaps in the directions perpendicular to these arrangement directions but also the position gaps in the above-mentioned respective directions are simultaneously generated, it is possible to detect the position gaps. Accordingly, the inspection accuracy of the connection defect and the short-circuiting defect of the first lines and the second lines is further enhanced and hence, the operability of the inspection of the operation of the display panels can be further enhanced.

Here, as in the case of the means (3), the determination terminal of the display panel may be electrically independently arranged from the respective first lines or, as in the case of the means (4), the determination terminal of the display panel is provided to the end portion of any one of the respective first lines.

Further, it is preferable that the determination potential supply line of the film-like substrate and the position gap detection line are electrically connected with the lines formed on the printed circuit board as in the case of the means (5). The determination potential supply line and the position gap detection line which are formed on the film-like substrate have extremely fine widths. Further, the second lines are formed on the film-like substrate densely. Accordingly, it is difficult to form a pad with which a conduction inspection probe is brought into contact on the film-like substrate. On the other hand, although the printed circuit board has a portion where the lines are formed densely, compared to the film-like substrate, it is possible to easily form an inspection pad with which the conduction inspection probe is brought into contact on the printed circuit board.

Further, the display device usually includes a plurality of film-like substrates and hence, in forming the means (5), it is preferable that the line which is electrically connected with the determination potential supply line or position gap detection lines of the respective film-like substrates is formed of the common line as in the case of the means (6). As in the case of the means (6), by forming the line which is connected with the position gap detection lines of the respective film-like substrates as the common line and by supplying a determination potential to the lines which are connected with the determination potential supply lines of the respective film-like substrate in order, it is possible to perform the determination of the position gap for every film-like substrate.

Further, by forming one line as the common line as in the case of the means (6), it is possible to decrease the number of inspection pads formed on the printed circuit board and, at the same time, it is possible to easily pull around the lines.

Further, in the display device, the film-like substrate constitutes a part of a driver IC which drives a display control element formed on the display panel and the semiconductor chip which includes a drive control circuit is usually mounted on the film-like substrate as in the case of the means (7).

Here, in assembling the display device, not only a step in which the first lines formed on the display panel and the second lines formed on the film-like substrate are electrically connected with each other, a step in which the second lines on the film-like substrate and the third lines formed on the printed circuit board are electrically connected with each other are provided. Accordingly, it is preferable that even when the second lines formed on the film-like substrate and the third lines formed on the printed circuit board are electrically connected with each other, the inspection (determination) of the position gap substantially equal to the inspection of the position gap at the time of electrically connecting the first lines and the second lines is performed. Here, in the display device, as in the case of the means (8), it is preferable that the conductive determination terminal is formed on the film-like substrate, the determination potential supply line and the position gap detection line are formed on the film-like substrate, and the determination terminal and the determination potential supply line are electrically connected with each other. Due to such a means, in the assembling steps of the display device, it is possible to easily determine the position gap between the third lines formed on the printed circuit board and the second lines formed on the film-like substrate by electrically connecting the third lines and the second lines and, thereafter, by inspecting the conduction between the determination potential supply line and the position gap detection line of the printed circuit board. Accordingly, immediately after the electrical connection between the third lines and the second lines, it is possible to inspect a connection defection or a short-circuiting defection between the third lines and the second lines whereby when each defect is generated, the display device is removed as a defective product and is corrected.

Here, as in the case of the means (9), it is preferable that the determination part of the determination terminal of the film-like substrate is formed in an annular shape which surrounds the position gap detection terminal in plane. Usually, the printed circuit board includes two-or-more-layered line layer on a surface and in the inside of an insulation substrate. Accordingly, by electrically connecting the position gap detection terminal to the lines formed on an outer region of the determination part by way of the line layer formed in the inside of the insulation substrate, it is possible to form the determination terminal of the film-like substrate in an annular shape. By forming the determination terminal in such a shape, it is possible to detect the position gaps in all directions thus enhancing the accuracy of the inspection of the connection defect or short-circuiting defect of the third line and the second line. As a result, in performing the inspection of the operation of the display panel, it is possible to perform the inspection of the display panels which are free from the generation of such defects and hence, the operability of the inspection of the operation of the display panel can be enhanced.

Here, the determination potential supply line of the printed circuit board may be formed of lines which are arranged electrically independent from the respective third lines as in the case of the means (10), while the determination potential supply line may be formed in common with any one of the respective third lines as in the case of the means (11).

Further, the display device includes, as mentioned previously, a plurality of film-like substrates. Accordingly, for example, in adopting the means (8), it is preferable to use the determination potential supply line or the position gap detection terminal of the printed circuit board as the common line as in the case of the means (12). In adopting the means (12), for example, by using the position gap detection terminal as the common line and by supplying the determination potential to the determination potential supply lines which are connected with the determination terminals of the respective film-like substrates in order, it is possible to perform the determination of the position gap for every film-like substrate. Further, by using one-side line as the common line as in the case of the means (12), it is possible to reduce the number of the inspection pads which are formed on the printed circuit board and, at the same time, it is possible to easily pull around the lines.

Further, the step-like notch may be formed in the second line or the determination terminal of the film-like substrate as in the case of the means (13) or the means (14), for example. Due to such a constitution, for example, based on the position of the end portion of the third line which is recognized by the step-like notched portion, it is possible to easily inspect the presence or the non-presence of the position gaps or the position gap directions of the third lines and the second lines. Accordingly, even when the position gap detection terminal is not formed on the printed circuit board, for example, it is possible to easily inspect and determine whether the connection defect or the short-circuiting defect attributed to the position gap is generated or not.

Further, in assembling the display device, in general, for example, the third lines of the printed circuit board and the second lines of the film-like substrate are electrically connected with each other and, thereafter, the second lines of the film-like substrate and the first lines of the display panel are electrically connected with each other. Accordingly, in the display device having the constitution of the means (8), it is preferable to adopt the constitution which can inspect and determine whether the connection defect or the short-circuiting defect of the first lines and the second lines attributed to the position gap when the first lines and the second lines are electrically connected with each other is generated or not as in the case of the means (15). Since the means (15) has the substantially equal constitution as the means (1), it is possible to easily inspect and determine whether the connection defect or the short-circuiting defect of the first lines and the second lines attributed to the position gap is generated or not immediately after electrically connecting the first lines and the second lines. Further, the constitution of the means (15) is formed on the premise of the means (8) and hence, in performing the inspection of the operation of the display panel, it is possible to perform the inspection of the display panels in which the third lines and the second lines are normally connected with each other and the first lines and the second lines are normally connected with each other and hence, the operability of the inspection of the operation of the display panel can be enhanced.

Further, the means (16) has the substantially same constitution as the means (2). Accordingly, by adopting the constitution of the means (16) on the premise of the means (15), it is possible to obtain the substantially equal advantageous effects obtained in the case in which the means (2) is adopted in the premise of the means (1). Here, the determination terminal of the display panel may be formed of a terminal which is arranged electrically independent from the respective first lines as in the case of the means (17) or may be formed on any one of the respective first lines as in the case of the means (18).

Further, for example, as in the case of the means (15), when the display device adopts the constitution in which the position gap between the second lines of the film-like substrate and the first lines of the display panel can be also inspected in addition to the inspection of the position gap between the third lines of the printed circuit board and the second lines of the film-like substrate, as in the case of the means (19), it is preferable to form the determination terminal of the film-like substrate on the end portion of the determination potential supply line of the film-like substrate. Due to such a constitution, the determination potential supply line of the printed circuit board which is used in the inspection of the position gap between the third lines of the printed circuit board and the second lines of the film-like substrate can be also used in the inspection of the position gap between the second lines of the film-like substrate and the first lines of the display panel.

Here, it is more preferable that, as in the case of the means (20), the position gap detection line of the film-like substrate is connected to the conductor terminal which is electrically connected with the position gap detection terminal of the printed circuit board. Due to such a constitution, the position gap detection line of the printed circuit board which is used in the inspection of the position gap between the third lines of the printed circuit board and the second lines of the film-like substrate can be also used in the inspection of the position gap between the second lines of the film-like substrate and the first lines of the display panel.

Further, in the display device, the film-like substrate constitutes a part of the driver IC which drives the display control elements formed on the display panel and, as in the case of the means (21), the semiconductor chip having a drive control circuit is mounted on the film-like substrate.

Further, the display panel of the display device is, for example, as in the case of the means (22), formed of a liquid crystal display panel. Here, the display panel is not limited to the liquid crystal display panel and may be formed of any display panel provided that the display panel is used in various kinds of display devices in which the first lines and the second lines on the film-like substrate are electrically connected with each other.

Further, in assembling the display devices having the constitutions of the means (1) to the means (7) and the means (15) to the means (22), the position gap between the first lines of the display panel and the second lines of the film-like substrate may be inspected by the inspection method of the means (23), for example.

Further, in assembling the display devices having the constitution of the means (8) to the means (22), the position gap between the third lines of the printed circuit board and the second lines of the film-like substrate may be inspected by the inspection method of the means (24), for example.

Here, the means (1) to the means (24) are specific constitutional examples of the present invention and, to extract the constitutions which form the gist of the present invention among the constitutional examples and recapitulate the constitutions, the constitutions can be expressed as the means (25) to (28). Here, in the means (25) to (28), the third lines and the fourth lines respectively correspond to the determination potential supply lines and the position gap detection lines of the film-like substrate in the means (1) to (24).

DESCRIPTION OF PREFERRED EMBODIMENTS

Hereinafter, the present invention is explained in detail in conjunction with the mode for carrying out the invention (embodiments) by referenced to drawings.

Here, in all drawings for explaining the embodiments, parts having identical functions are given same numerals and their explanation is omitted.

In the display device of the present invention, on a display panel, determination terminals which determine at least position gaps in two directions consisting of the arrangement direction of first lines which are formed on the display panel and the direction perpendicular to the arrangement direction are formed. Due to such a constitution, it is possible to easily inspect and the determine a connection defect or a short-circuiting defect attributed to a position gap which is generated when first lines on the display panel and second lines which are formed on a film-like substrate such as a driver IC for driving the display device are electrically connected with each other and, at the same time, the inspection accuracy can be enhanced.

Further, it is possible to easily perform the inspection and the determination of a connection defect or a short-circuiting defect attributed to a position gap which is generated when the second lines formed on the film-like substrate and third lines formed on a printed circuit board are connected with each other by using a method substantially equal to a method for inspecting and determining a connection defect or a short-circuiting defect between the first lines and the second lines and, at the same time, the inspection accuracy can be enhanced.

Further, by performing the inspection and the determination of the connection defect or the short-circuiting defect between the first lines and the second lines or between the second lines and the third lines immediately after the connection of the first lines and the second lines or immediately after the connection of the second lines and the third lines, it is possible to enhance the operability of the inspection of the operation of the display panel.

Embodiment 1

Figure 1:
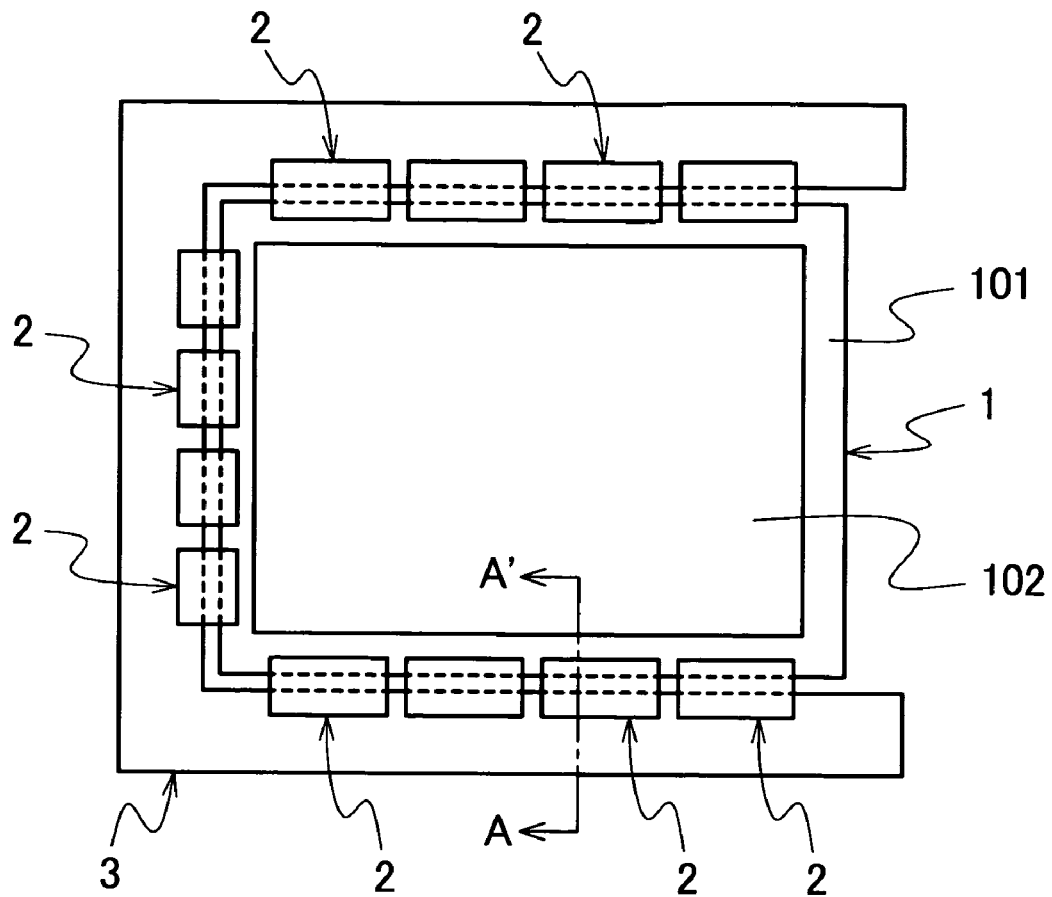
FIG. 1 is a schematic view showing the schematic constitution of a display device of an embodiment 1 according to the present invention, and also is a plan view showing a state that a liquid crystal display panel, a film-like substrate and a printed circuit board are connected with each other.
Figure 2:
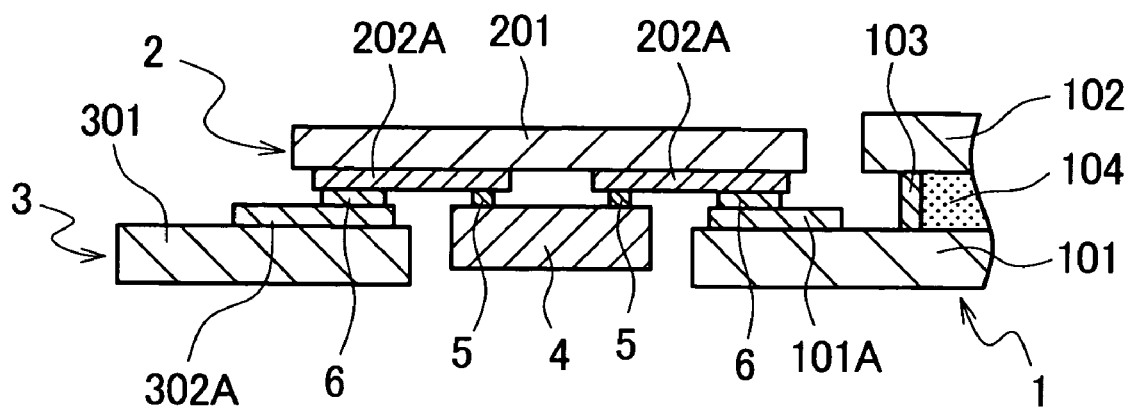
FIG. 2 is a schematic view showing the schematic constitution of the display device of the embodiment 1 according to the present invention, and also is a cross-sectional view taken along a line A-A' in FIG. 1.
Figure 3:
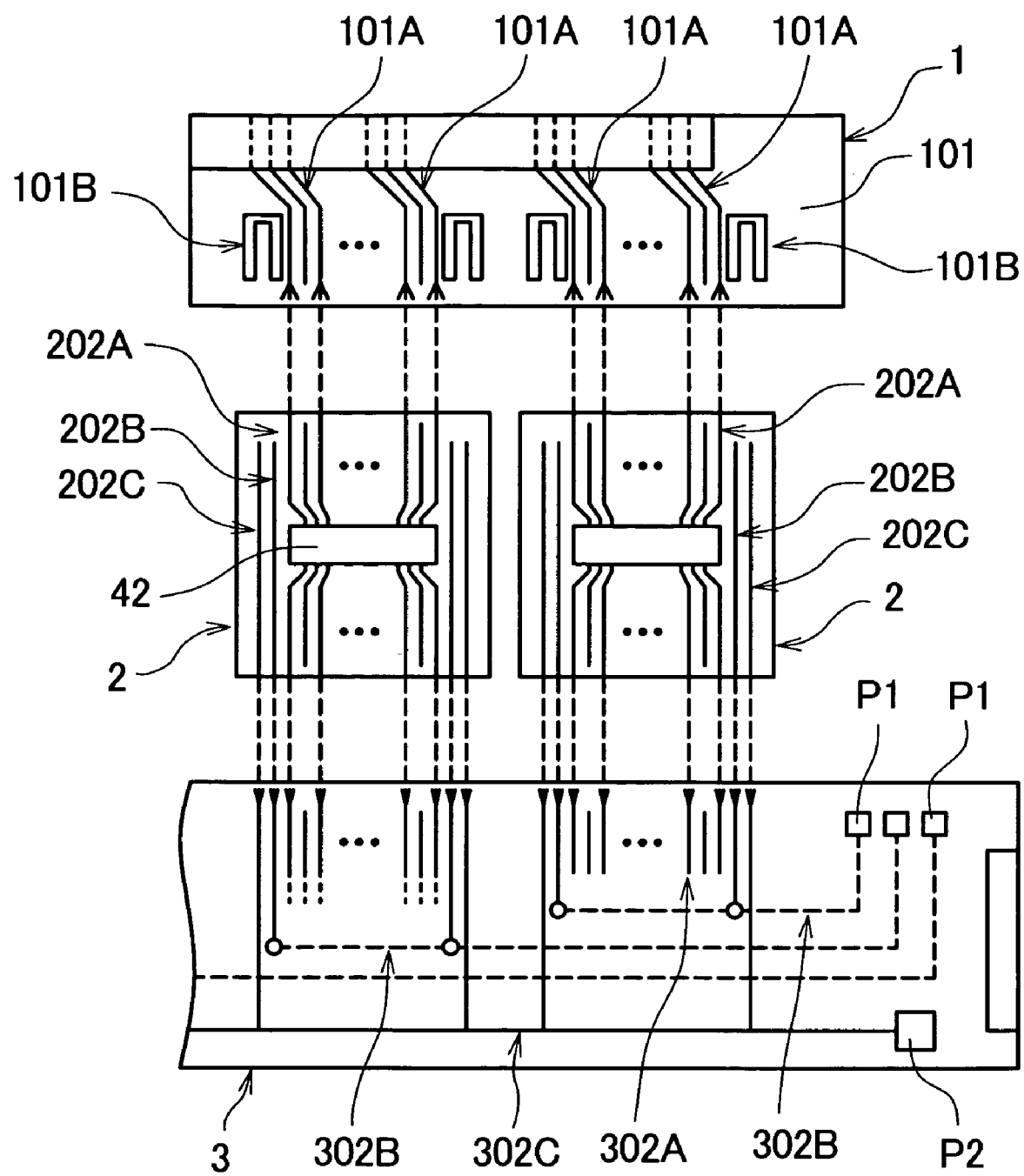
FIG. 3 is a schematic view showing the schematic constitution of the display device of the embodiment 1 according to the present invention, and also is an exploded view for explaining a connection method of the liquid crystal display panel, the film-like substrate and a printed circuit board.
Figure 4:
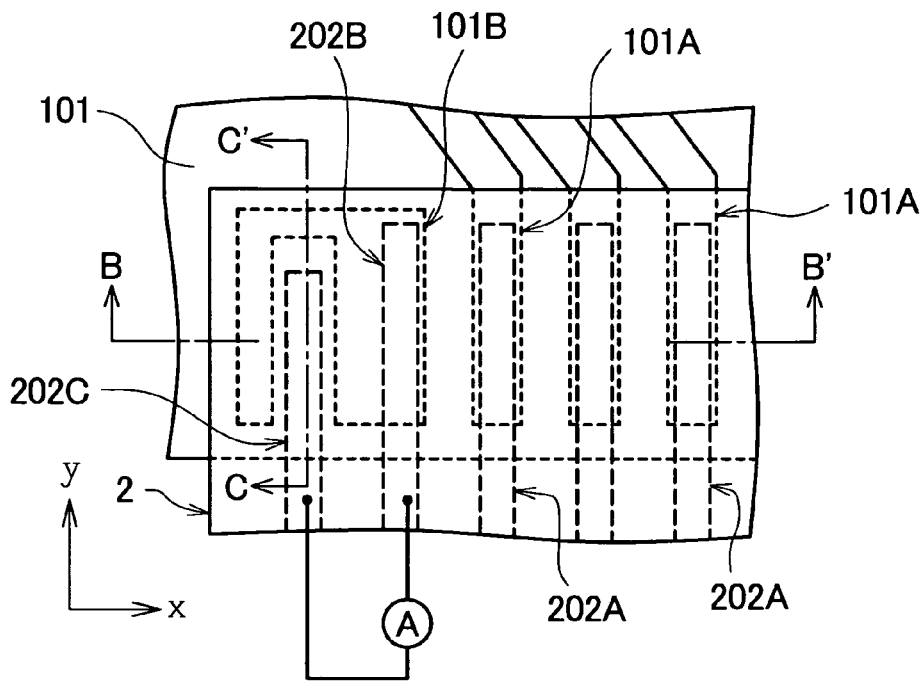
FIG. 4 is a schematic view showing the schematic constitution of the display device of the embodiment 1 according to the present invention, and also is an enlarged plan view of a connection portion which connects the liquid crystal display panel and the film-like substrate.
Figure 5:
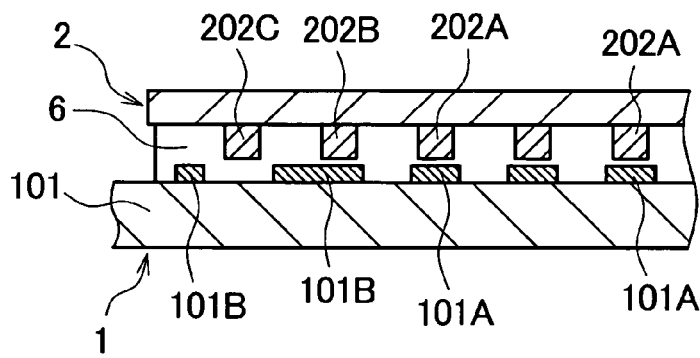
FIG. 5 is a schematic view showing the schematic constitution of the display device of the embodiment 1 according to the present invention, and also is a cross-sectional view taken along a line B-B' in FIG. 4.
Figure 6:
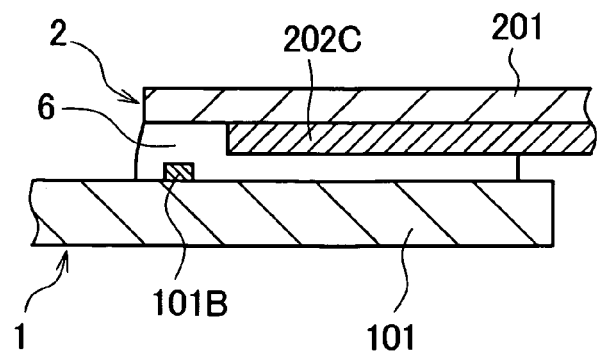
FIG. 6 is a schematic view showing the schematic constitution of the display device of the embodiment 1 according to the present invention, and also is a cross-sectional view taken along a line C-C' in FIG. 4.

FIG. 1 to FIG. 6 are schematic views showing the schematic constitution of a display device according to an embodiment 1 of the present invention, wherein FIG. 1 is a plan view showing a state that a liquid crystal display panel, a film-like substrate and a printed circuit board are connected with each other, FIG. 2 is a cross-sectional view taken along a line A-A' in FIG. 1, FIG. 3 is an exploded view for explaining a connection method of the liquid crystal display panel, the film-like substrate and a printed circuit board, FIG. 4 is an enlarged plan view of a connection portion which connects the liquid crystal display panel and the film-like substrate, FIG. 5 is a cross-sectional view taken along a line B-B' in FIG. 4, and FIG. 6 is a cross-sectional view taken along a line C-C' in FIG. 4.

In FIG. 1 to FIG. 6, numeral 1 indicates a liquid crystal display panel, numeral 101 indicates a first substrate, numeral 101A indicates first lines, numeral 101B indicates a determination terminal, numeral 102 indicates a second substrate, numeral 103 indicates a sealing material, numeral 104 indicates a liquid crystal material, numeral 2 indicates a film-like substrate, numeral 201 indicates an insulation substrate, numeral 202A indicates second lines, numeral 202B indicates determination potential supply lines, numeral 202C indicates position gap detection lines, numeral 3 indicates a printed circuit board, numeral 301 indicates an insulation substrate, numeral 302A indicates third lines, numeral 302B indicates determination potential supply lines, numeral 302C indicates position gap detection lines, numeral 4 indicates a semiconductor chip, numeral 5 indicates connection conductors, numeral 6 indicates an ACF, symbol P1 indicates determination potential input pads, and symbol P2 indicates a determination pad.

The display device of the embodiment 1 includes, for example, as shown in FIG. 1, a display panel 1, a film-like substrate 2 and a printed circuit board 3.

The display panel 1 is, for example, a liquid crystal display panel. Here, as shown in FIG. 2, the liquid crystal material 104 is sealed in a space which is surrounded by the first substrate 101 and a second substrate 102 which are made of a transparent substrate such as a glass substrate or the like and the sealing material 103. Further, the display panel 1, for example, as shown in FIG. 2 and FIG. 3, forms the first lines 101A and the determination terminals 101B on a surface of the first substrate 101. The first lines 101A are, for example, lines which become necessary for displaying an image on the display panel 1 such as lines for forming elements such as TFTs which apply a voltage to the liquid crystal material 104, while the determination terminals 101B constitute terminals (lines) for inspecting position gaps.

Here, when the liquid crystal display panel is used as the display panel 1, out of the constitution of the display panel 1, other constitution except for the determination terminals 101B may be substantially equal to the corresponding constitution of a conventional general liquid crystal display panel. Accordingly, detailed explanation of parts having the constitution substantially equal to corresponding parts of the conventional general liquid crystal display panel is omitted. Further, the constitution of the determination terminals 101B is explained later.

With respect to the film-like substrate 2, for example, as shown in FIG. 2 and FIG. 3, the second lines 202A, the determination potential supply lines 202B and the position gap detection lines 202C are formed on the surface of the film-like insulation substrate 201. The film-like substrate 2 is a printed circuit board (interposer) which is used in a semiconductor device (package) which is referred to as a TCP (Tape Carrier Package) or a COF (Chip On Film) on which a driver IC for driving liquid crystal is mounted. Here, as shown in FIG. 2, the second lines 202A are electrically connected with outer electrodes (not shown in the drawing) of the semiconductor chip 4 via the connection conductors 5. Further, the second lines 202A are, as shown in FIG. 2 to FIG. 5, electrically connected with the first lines 101A of the display panel 1. The second lines 202A and the first lines 101A are, for example, as shown in FIG. 2 and FIG. 5, electrically connected with each other via a non-contact conduction using the ACF (Anisotropic Conductive Film) 6. Further, the second lines 202A and the first lines 101A may be electrically connected with each other by bonding using a bonding material such as metal or solder in place of using the ACF 6.

Further, the determination potential supply lines 202B and the position gap detection lines 202C which are formed on the film-like substrate 2 are lines for inspecting the position gaps by making use of the determination terminals 101B formed on the display panel 1 when the first lines 101A and the second lines 202A are electrically connected with each other. Here, in this embodiment 1, the determination potential supply lines 202B and the position gap detection lines 202C are, as shown in FIG. 3, lines which are not electrically connected with outer electrodes of the semiconductor chip 4 and are lines which are provided for inspecting the position gaps. Further, the determination potential supply lines 202B are electrically connected with the second lines 202A in the same manner as the first lines 101A and are, for example, as shown in FIG. 4 and FIG. 5, electrically connected with the second lines 202A via a non-contact conduction using the ACF 6.

Further, the position gap detection lines 202C are, as shown in FIG. 4 to FIG. 6, configured not to be electrically connected with the first lines 101A and the determination terminals 101B of the display panel 1. Here, the determination terminals 101B are, for example, as shown in FIG. 4, configured to pass in the extending direction (+y direction) of the position gap detection lines 202C and includes a determination part having a shape which surrounds the end portion of the position gap detection lines 202C in plane.

Further, the printed circuit board 3 forms, for example, as shown in FIG. 2 and FIG. 3, the third lines 302A, the lines 302B which are electrically connected with the determination potential input pads P1, and the position gap detection line 302C which is electrically connected with the determination pad P2 on a surface of the insulation substrate 301. The third lines 302A are lines which are electrically connected with the second lines 202A of the film-like substrate 2 and constitute lines which are necessary for displaying an image on the display panel 1. The determination potential supply lines 302B which are electrically connected with the determination potential input pads P1 constitute lines which are electrically connected with the determination potential supply lines 202B of the film-like substrate 2. Further, the position gap detection lines 302C which are electrically connected with the determination pads P2 constitute lines which are electrically connected with the position gap detection lines 202C of the film-like substrate 2. The respective lines 302A, 302B, 302C which are formed on the printed circuit board 3 and the respective lines 202A, 202B, 202C which are formed on the film-like substrate 2 are, for example, as shown in FIG. 2, electrically connected with each other via a non-contact conduction using the ACF 6. Further, the respective lines 302A, 302B, 302C which are formed on the printed circuit board 3 and the respective lines 202A, 202B, 202C which are formed on the film-like substrate 2 may be electrically connected with each other using a bonding material such as gold or solder in place of using the ACF 6.

Further, the printed circuit board 3 includes two-or-more layered line layers on a surface and the inside of the insulation substrate 301, and the third lines 302A, the determination potential supply lines 302B which are electrically connected with the determination potential input pads P1 and the position gap detection lines 302C which are electrically connected with the determination pad P2 are, when necessary, pulled out to preset positions on a surface of the insulation substrate 301 via the inner line layer of the insulation substrate 301.

Figure 7:
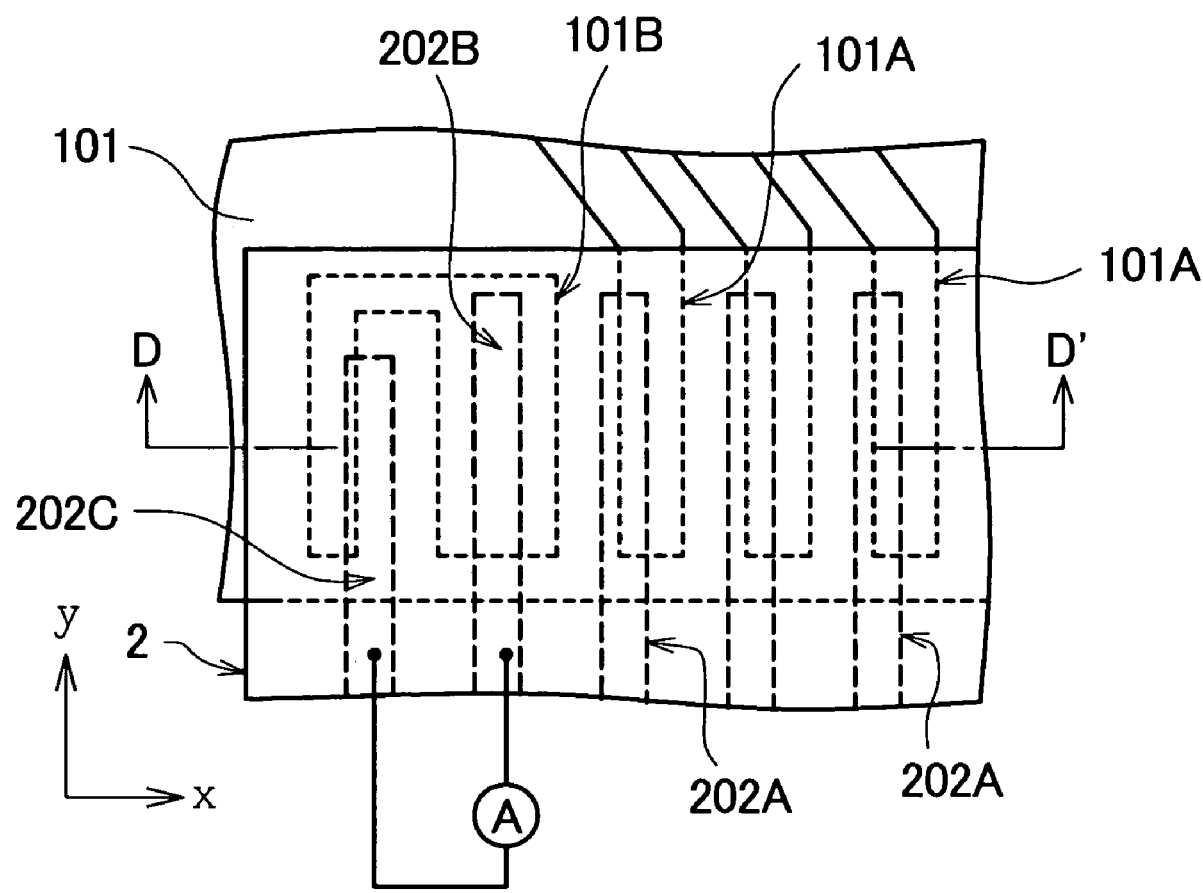
FIG. 7 is a schematic view for explaining an inspection method of a position gap of the display device of the embodiment 1, and also is a plan view showing a case in which a position gap of lines is generated in a line width direction.
Figure 8:
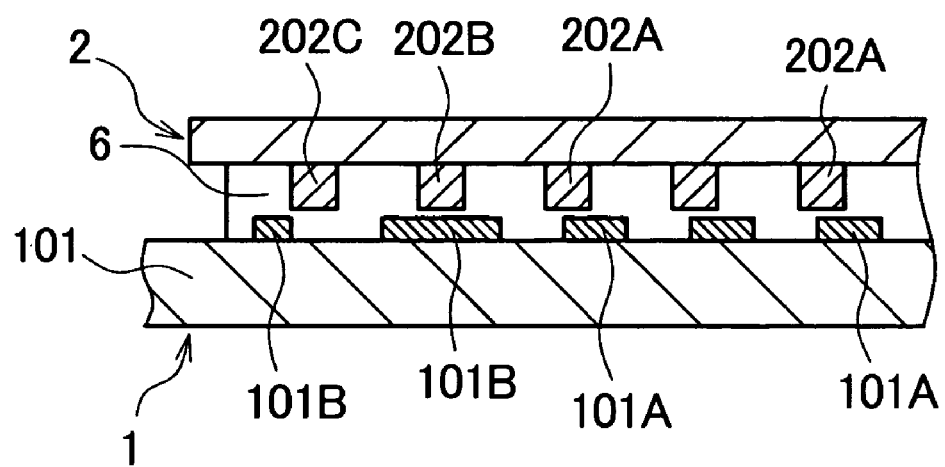
FIG. 8 is a schematic view for explaining the inspection method of the position gap of the display device of the embodiment 1, and also is a cross-sectional view taken along a line D-D' in FIG. 7.
Figure 9:
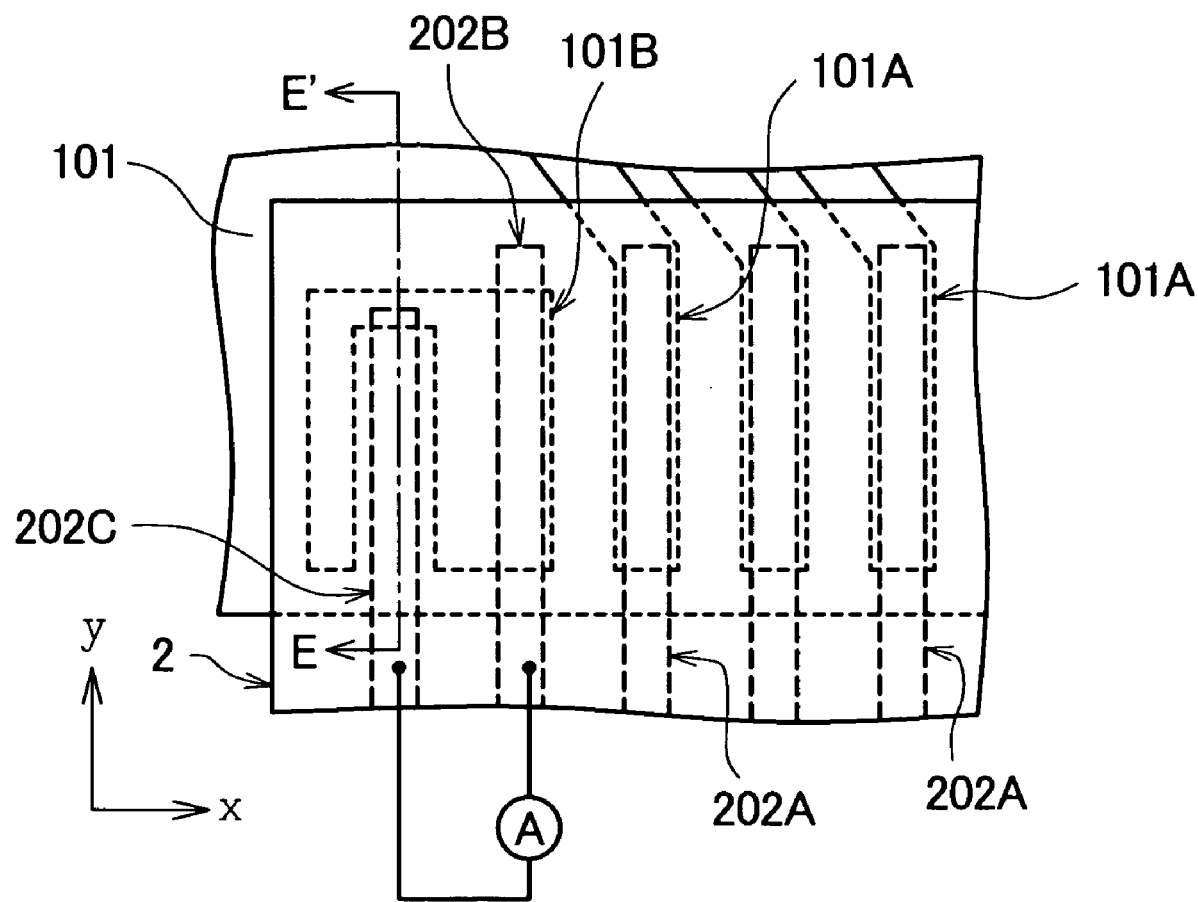
FIG. 9 is a schematic view for explaining the inspection method of the position gap of the display device of the embodiment 1, and also is a plan view showing a case in which a position gap of lines is generated in an extending direction.
Figure 10:
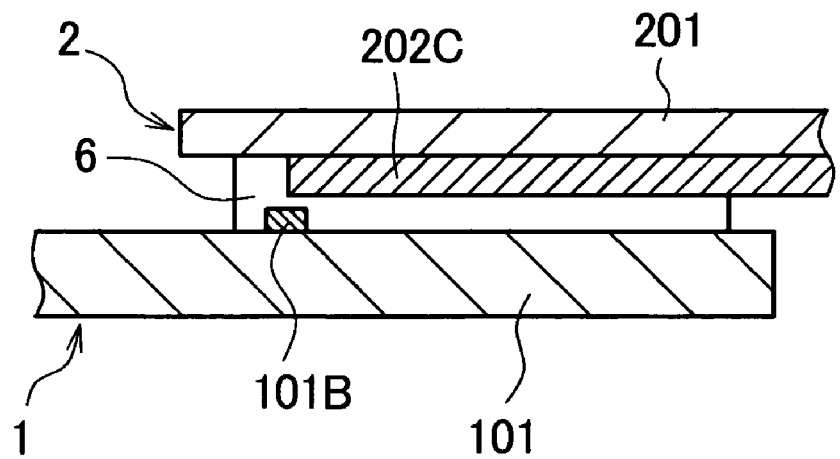
FIG. 10 is a schematic view for explaining the inspection method of the position gap of the display device of the embodiment 1, and also is a cross-sectional view taken along a line E-E' in FIG. 9.

FIG. 7 to FIG. 10 are schematic views for explaining an inspection method of a position gap of the display device of the embodiment 1, wherein FIG. 7 is a plan view showing a case in which a position gap of lines is generated in a line width direction, FIG. 8 is a cross-sectional view taken along a line D-D' in FIG. 7, FIG. 9 is a plan view showing a case in which a position gap of lines is generated in an extending direction, and FIG. 10 is a cross-sectional view taken along a line E-E' in FIG. 9.

In the display device of this embodiment 1, the connection portions of the first lines 101A of the display panel 1 and the second lines 202A of the film-like substrate 2 are, for example, formed as shown in FIG. 4, wherein the first lines 101A and the second lines 202A are accurately connected with each other. In this case, although the determination terminals 101B of the display panel 1 are electrically connected with the determination potential supply lines 202B of the film-like substrate 2, the determination terminals 101B assume a state in which the determination terminals 101B are electrically insulated from the position gap detection lines 202C. Accordingly, for example, as shown in FIG. 4, in inspecting the conduction between the determination potential supply lines 202B and the position gap detection lines 202C, there is no conduction. As a result, it is determined that the position gap is not generated or the position gap is within an allowable range.

Here, in the display device of this embodiment 1, in inspecting the conduction between the determination potential supply lines 202B and the position gap detection lines 202C, for example, detection probes are brought into contact with the determination potential input pads P1 and the determination pad P2 formed on the printed circuit board 3 as shown in FIG. 3 and, thereafter, a determination potential is inputted to the determination potential input pads P1 and the determination pad P2. Here, the determination potential input pad P1 is provided for every plural film-like substrates 2 and the determination potential is inputted in order thus enabling the inspection of the conduction for every film-like substrate 2.

In connecting the first lines 101A and the second lines 202A, for example, using an optical observation, the alignment is performed such that the first lines 101A and the second lines 202A assume the accurate positional relationship as shown in FIG. 4. However, when a pressure is applied due to thermal compression bonding at the time of performing the connection, there may be case that a position gap is generated in the line width direction at the connection portion of the first lines 101A and the second lines 202A (hereinafter simply referred to as "line width direction), that is, in the x direction shown in FIG. 4. Here, when the position gap in the line width direction (x direction) is large, for example, as shown in FIG. 7 and FIG. 8, the position gap detection lines 202C of the film-like substrate 2 are overlapped to the determination parts of the determination terminals 101B of the display panel 1. When the conduction between the determination potential supply lines 202B and the position gap detection lines 202C is inspected, the conduction is established between the position gap detection lines 202C and the determination terminals 101B. As a result, it is determined that the position gap which exceeds the allowable range is generated.

Further, in connecting the first lines 101A and the second lines 202A, for example, the position gap is not limited to the position gap of lines in the line width direction (x direction) shown in FIG. 7 and FIG. 8, for example, there may arise a case that the position gap is also generated in the y direction perpendicular to the line width direction (hereinafter referred to as "extending direction") as shown in FIG. 9 and FIG. 10.

Here, when the position gap in the extending direction (y direction) of the lines is large, for example, as shown in FIG. 9 and FIG. 10, the position gap detection lines 202C of the film-like substrate 2 are overlapped to the determination parts of the determination terminals 101B of the display panel 1. When the conduction between the determination potential supply lines 202B and the position gap detection lines 202C is inspected in such a state, the conduction is established between the position gap detection lines 202C and the determination terminals 101B and hence, the position gap detection lines 202C and the determination terminal 101B become conductive with each other. As a result, it is determined that the position gap which exceeds the allowable range is generated.

Further, in the display device of this embodiment 1, in inspecting the conduction between the determination potential supply lines 202B and the position gap detection lines 202C, for example, the detection probes are brought into contact with the determination potential input pads P1 and the determination pad P2 formed on the printed circuit board 3 as shown in FIG. 3 and, thereafter, the determination potential is inputted to the determination potential input pads P1 and the determination pad P2. Here, the determination potential input pad P1 is provided for every plural film-like substrates 2 and the determination potential is inputted in order thus enabling the inspection of the conduction for every film-like substrate 2.

In this manner, in the display device of this embodiment 1, it is possible to easily inspect and determine whether the connection defect or the short-circuiting defect attributed to the position gap is generated immediately after connecting the first lines 101A of the display panel 1 and the second lines 202A of the film-like substrate 2. Accordingly, when the connection defect or the short-circuiting defect is generated, the correction can be made on a site by removing the defect. As a result, in inspecting the display operation of the display panel 1, it is possible to inspect only the display panels 1 in which the first lines 101A and the second lines 202A are accurately connected with each other thus enhancing the operability of the inspection of the display operation.

Figure 11:
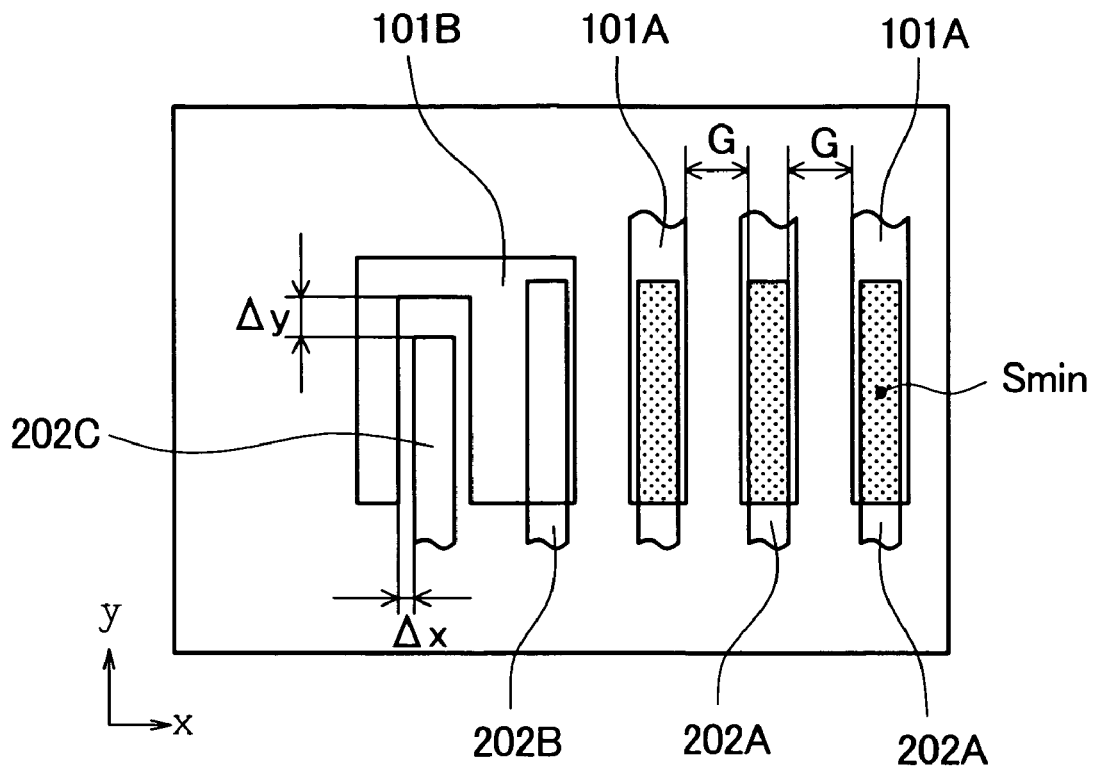
FIG. 11 is a schematic view for explaining a relationship between a determination terminal of the display panel and a position gap detection line of the film-like substrate of the display device of the embodiment 1, and also is a plan view for defining the planner positional relationship between the determination terminal and the position gap detection line.
Figure 12:
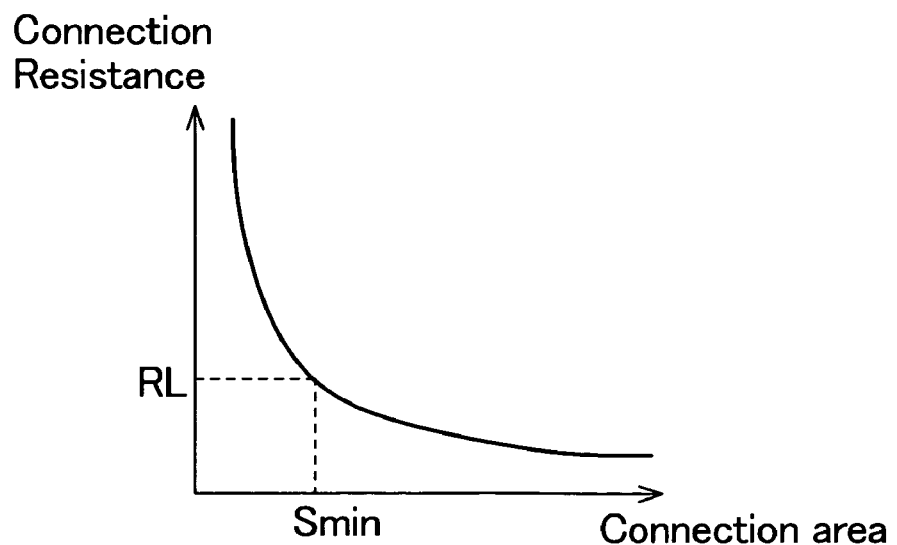
FIG. 12 is a schematic view for explaining a relationship between the determination terminal of the display panel and the position gap detection line of the film-like substrate of the display device of the embodiment 1, and also is a view showing one example of a connection characteristic curve of ACF which is used in connecting lines.

FIG. 11 and FIG. 12 are schematic views for explaining a relationship between the determination terminal of the display panel and the position gap detection line of the film-like substrate of the display device of the embodiment 1, wherein FIG. 11 is a plan view for defining the planar positional relationship between the determination terminal of the display panel and the position gap detection line, and FIG. 12 is a view showing one example of a connection characteristic curve of ACF 6 which is used in connecting lines.

In the display device of the embodiment 1, whether the connection defect or the short-circuiting defect attributed to the position gap is generated between the first lines 101A of the display panel 1 and the second lines 202A of the film-like substrate 2 or not is determined based on the presence or the non-presence of conduction between the determination potential supply lines 202B and the position gap detection lines 202C. Accordingly, for example, as shown in FIG. 11, the accuracy of the result of determination differs depending on the setting of planar distances $\Delta x$, $\Delta y$ between the position gap detection lines 202C and the determination part of determination terminals 101B in a state that the first lines 101A and the second lines 202A are accurately connected with each other. Accordingly, one example of the manner of setting the planar distances $\Delta x$, $\Delta y$ between the position gap detection lines 202C and the determination part of determination terminals 101B is briefly explained.

First of all, for example, with respect to the connection resistance when the first lines 101A and the second lines 202A are connected with each other, for example, as shown in FIG. 12, a minimum contact area S min is decided based on a smallest value RL out of a connection resistance value required in a connection portion between each first line 101A and the second line 202A and the connection characteristic of the ACF 6 used for connecting the first line 101A and the second line 202A. Then, sizes of the respective lines 101A, 202A, the minimum contact area 5 min and the minimum connection lengths Mx, My in the x direction and in the y direction are obtained.

Next, for example, based on the connection characteristic of the ACF 6 shown in FIG. 12, a minimum conductor gap G between the first line 101A and the second line 202A is obtained.

Then, the distance Δx in the x direction between the position gap detection lines 202C and the determination terminals 101B is set to either one of the minimum connection length Mx and the minimum conductor gap G in the x direction. Further, the distance Δy in the y direction between the position gap detection lines 202C and the determination terminals 101B is set to the minimum connection length My in the y direction. Here, when there exists other restriction in designing the lines besides the minimum connection lengths Mx, My and the minimum conductor gap G, such a restriction is also taken into consideration and the minimum value (size) among the minimum connection lengths Mx, My and the minimum conductor gap G is set as the planar distances Δx, Δy between the position gap detection lines 202C and the determination part of the determination terminals 101B. Due to such a constitution, it is possible to make the condition which generates the connection defect or the short-circuiting defect between the first lines 101A and the second line 202A reflect on the presence or the non-presence of the conduction between the determination potential supply lines 202B and the position gap detection lines 202C and hence, it is possible to perform the highly accurate inspection and the determination.

Figure 13:
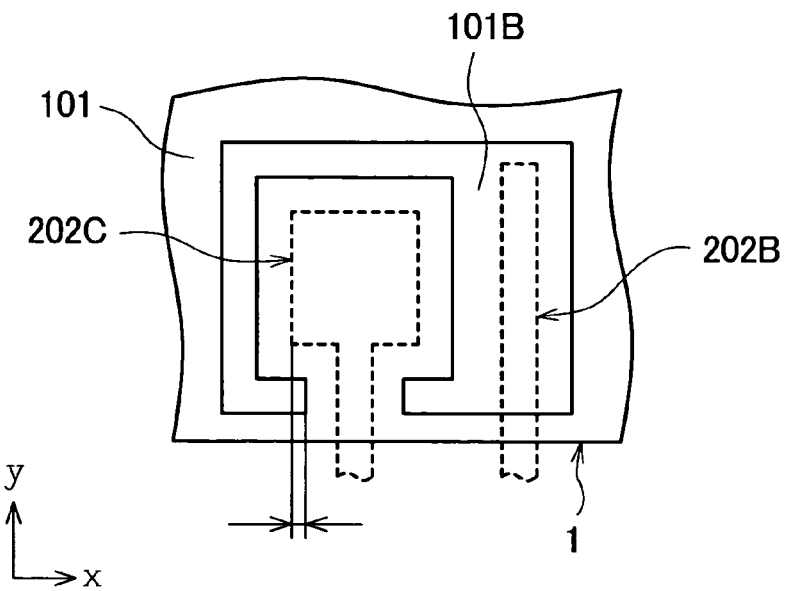
FIG. 13 is a schematic view for explaining a modification of the display device of the embodiment 1, and also is a view showing a modification of a shape of the determination terminal of the display panel and the position gap detection line of the film-like substrate.

FIG. 13 is a schematic view for explaining a modification of the display device of embodiment 1, and also is a view showing a modification of a shape of the determination terminal of the display panel and the position gap detection line of the film-like substrate.

In the display device of this embodiment 1, for example, as shown in FIG. 4, by forming the determination part of the determination terminal 101B which is formed on the display panel 1 into the shape which surrounds the distal end portion of the position gap detection lines 202C formed on the film-like substrate 2 in plane, it is possible to easily detect not only the position gap in the line width direction (x direction) of the connection portions between the first lines 101A and the second lines 202A but also the position gap in the extending direction (y direction) of the lines which are perpendicular to the line width direction.

However, when the determination part of the determination terminals 101B has the shape shown in FIG. 4, with respect to the position gap in the extending direction of the lines, it is possible to detect only the position gap in the +y direction from the preset position.

Accordingly, for example, as shown in FIG. 13, it is preferable to increase the line width of the distal end portion of the position gap detection lines 202C and to form the determination part of the determination terminals 101B into a non-continuous annular shape which surrounds the region of the position gap detection lines 202C where the line width is increased. Here, the distance of an opened portion of the annular shape is set smaller than the line width of the region of the position gap detection lines 202C where the line width is increased. Due to such a constitution, it is also possible to detect the position gap in the −y direction from a preset position and hence, the detection accuracy of the connection defect attributed to the position gap can be enhanced. Further, in the example shown in FIG. 13, the region of the position gap detection lines 202C where the line width is increased has a rectangular shape and the determination part of the determination terminal 101B also has the annular shape having corner portions. However, this embodiment is not limited to such an example and, for example, region of the position gap detection lines 202C where the line width is increased may be formed in a circular shape and the determination part of the determination terminals 101B may be formed in an annular shape which is concentric with the circular region of the position gap detection lines 202C.

As has been explained above, according to the display device of this embodiment 1, immediately after connecting the first lines 101A of the display panel 1 and the second lines 202A of the film-like substrate 2, it is possible to inspect the presence or the non-presence of the position gap between the first lines 101A and the second lines 202A thus easily determining whether the connection defect or the short-circuiting defect is generated or not.

Further, by forming the determination part of the determination terminals 101B of the display panel 1 into the shape which surrounds the distal end of the position gap detection lines 202C of the film-like substrate 2, it is possible to inspect the presence or the non-presence of the position gap not only in the line width direction of the connection portion between the first lines 101A an the second lines 202A but also the position gaps in all directions.

Further, in the display device of this embodiment 1, it is possible to perform the inspection and the determination immediately after the first lines 101A of the display panel 1 and the second lines 202A of the film-like substrate 2 are connected with each other. Accordingly, when it is determined that the connection defect or the short-circuiting defect is generated, it is possible to correct such a defect on a site. As a result, in inspecting the display operation of the display panel 1, it is possible to inspect only the display panels 1 which are free from the connection defect or the short-circuiting defect and hence, the operability of the inspection of the display operation can be enhanced.

Further, by connecting the determination potential supply lines 202B and the position gap detection lines 202C of the film-like substrate 2 with the lines of the printed circuit board 3, the operability of the inspection of the presence or the non-presence of the position gap between the first lines 101A and the second lines 202A can be enhanced. Here, since the plural film-like substrates 2 are provided, by forming the lines of the printed circuit board 3 which are connected with the determination potential supply lines 202B or the lines of the printed circuit board 3 which are connected with the position gap detection lines 202C as the common lines, it is possible to easily pull around the lines of the printed circuit board 3 and, at the same time, it is possible to inspect and determine the presence or the non-presence of the position gap for every film-like substrate 2.

Further, in the embodiment 1, the determination terminals 101B of the display panel 1 are set as terminals for inspecting the position gap which are arranged electrically independent from the first lines 101A. However, this embodiment is not limited to such a constitution and a determination part having a shape substantially equal to the shape of the determination part of the determination terminal 101B may be formed on an end portion of the first line 101A. In this case, the determination potential supply lines 202B of the film-like substrate 2 constitute the second lines 202A which are electrically connected with the first lines 101A having the determination part.

Embodiment 2

Figure 14:
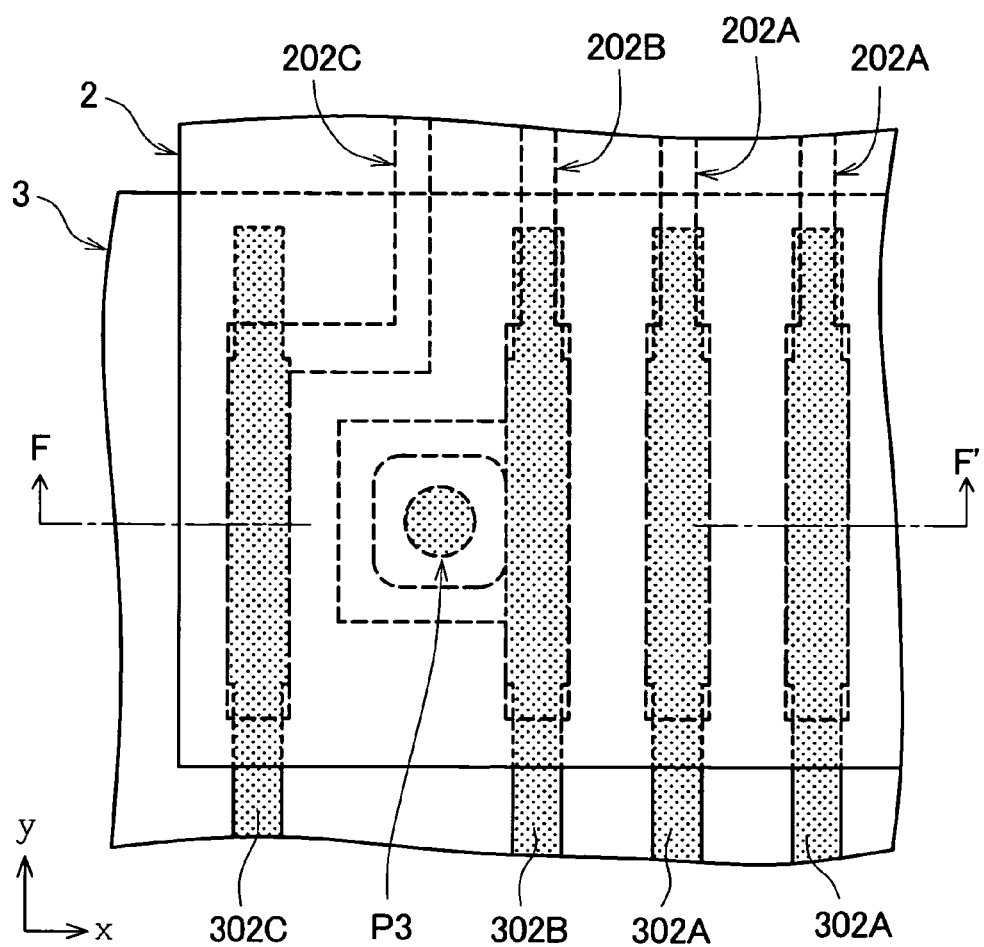
FIG. 14 is a schematic view showing the schematic constitution of the display device of the embodiment 2 according to the present invention, and also is an enlarged plan view showing the constitutional example of the connection portion which connects the film-like substrate and the printed circuit board.
Figure 15:
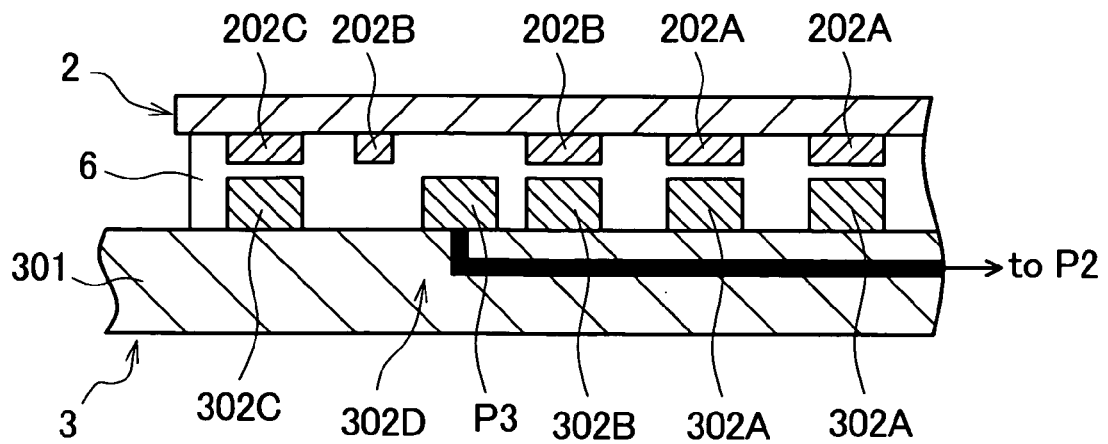
FIG. 15 is a schematic view showing the schematic constitution of the display device of the embodiment 2 according to the present invention, and also is a cross-sectional view taken along a line F-F' in FIG. 14.

FIG. 14 and FIG. 15 are schematic views showing the schematic constitution of the display device of the embodiment 2 according to the present invention, wherein FIG. 14 is an enlarged plan view showing the constitutional example of the connection portion which connects the film-like substrate and the printed circuit board, and FIG. 15 is a cross-sectional view taken along a line F-F' in FIG. 14.

In FIG. 14 and FIG. 15, symbol P3 indicates a position gap detection terminal and numeral 302D indicates inner lines.

The display device of this embodiment 1 can easily inspect and determine the presence or the non-presence of the position gap when the first lines 101A of the display panel 1 and the second lines 202A of the film-like substrate 2 are electrically connected with other and hence, the display device can enhance the operability in inspecting the display operation of the display panel 1. However, the second lines 202A of the film-like substrate 2 are, as explained in conjunction with the embodiment 1, also connected with the third lines 302A of the printed circuit board 3. Accordingly, there exists a possibility that the connection defect or the short-circuiting defect attributed to the position gap is generated in connecting the second lines 202A and the third lines 302A. Accordingly, in this embodiment 2, on the premise of the constitution explained in conjunction with the embodiment 1, a constitutional example of the display device which can easily inspect the presence or the non-presence of the position gap when the second lines 202A and the third lines 302A are connected with each other is explained.

Here, the basic constitutions of the display panel 1, the film-like substrate 2 and the printed circuit board 3 in the display device of the embodiment 2 are substantially equal to corresponding parts of the display device of the embodiment 1 and hence, their detailed explanation is omitted.

In the display device of this embodiment 2, as shown in FIG. 14 and FIG. 15, the determination potential supply lines 202B which are formed on the film-like substrate 2 are electrically connected with the determination potential supply lines 302B formed on the printed circuit board 3. Here, the determination potential supply line 202B of the film-like substrate 2 has an annular determination part at a connection portion thereof with the determination potential supply lines 302B of the printed circuit board 3. Further, a position gap detection terminal P3 which is electrically insulated from the determination potential supply line 202B of the film-like substrate 2 is formed in an inner region of the annular determination part. The position gap detection terminal P3 is, for example, as shown in FIG. 15, electrically connected with the determination pad P2 formed on the printed circuit board 3 via the inner lines 302D.

Further, the respective lines 202A, 202B, 202C of the film-like substrate 2 and the respective lines 302A, 302B, 302C of the printed circuit board 3 are respectively electrically connected with each other via a non-contact conduction using the ACF 6, for example. Here, the connection between the respective lines 202A, 202B, 202C of the film-like substrate 2 and the respective lines 302A, 302B, 302C of the printed circuit board 3 is not limited to the connection using the ACF 6 and such a connection may be performed using a bonding material such as gold, solder or the like, for example.

In this manner, by forming the annular determination part on the determination potential supply lines 202B of the film-like substrate 2 and the position gap detection terminal P3 on the printed circuit board 3, for example, by electrically connecting the respective lines 202A, 202B, 202C of the film-like substrate 2 and the respective lines 302A, 302B, 302C of the printed circuit board 3 and, thereafter, by inspecting the conduction between the determination potential supply lines 302B of the printed circuit board 3 and the position gap detection lines 302C (position gap detection terminals P3), it is possible to inspect and determine the presence or the non-presence of the position gap between the second lines 202A and the third lines 302A.

Here, by setting a planar distance between the position gap detection terminals P3 of the printed circuit board 3 and the determination part of the determination potential supply lines 202B of the film-like substrate 2 in the manner explained in conjunction with the embodiment 1, it is possible to make the condition which generates the connection defect or the short-circuiting defect between the second lines 202A and the third lines 302A reflect on the presence or the non-presence of the conduction between the determination potential supply lines 302B of the printed circuit board 3 and the position gap detection lines 302C (position gap detection terminal P3) and hence, it is possible to perform the highly accurate inspection and the determination.

Here, as explained in conjunction with the embodiment 1, the plural film-like substrates 2 are provided usually. Accordingly, for example, as shown in FIG. 3, by forming the position gap detection lines 302C of the printed circuit board 3 as the common lines, it is possible to easily pull around the lines of the printed circuit board 3 and, at the same time, it is possible to easily inspect and determine the position gap for every film-like substrate 2.

Further, in assembling the display device, the second lines 202A of the film-like substrate 2 and the third lines 302A of the printed circuit board 3 are electrically connected with each other and, thereafter, the second lines 202A of the film-like substrate 2 and the first lines 101A of the display panel 1 are electrically connected with each other. Accordingly, as in the case of the embodiment 2, by forming the annular determination part on the determination potential supply lines 202B of the film-like substrate 2, by electrically connecting the determination potential supply lines 202B of the film-like substrate 2 and the determination potential supply lines 302B of the printed circuit board 3, and by electrically connecting the position gap detection lines 202C of the film-like substrate 2 and the position gap detection lines 302C of the printed circuit board 3, with the use of one set of the determination potential supply line 302B and the position gap detection lines 302C formed on the printed circuit board 3, it is possible to perform the inspection and the determination of the position gap between the second lines 202A and the third lines 302A and the inspection and the determination of the position gap between the second lines 202A and the third lines 302A.

As explained above, according to the display device of the embodiment 2, immediately after the third lines 302A of the printed circuit board 3 and the second lines 202A of the film-like substrate 2 are electrically connected with each other, the presence or the non-presence of the position gap between the third lines 302A and the second lines 202A is inspected and hence, it is possible to easily determine whether the connection defect or the short-circuiting defect is generated or not.

Further, by forming the annular determination part which surrounds the position gap detection terminal P3 of the printed circuit board 3 on the determination potential supply lines 202B of the film-like substrate 2, it is possible to inspect not only the presence or the non-presence of the position gap in the line width direction of the connection portion of the third lines 302A and the second lines 202A but also the presence or the non-presence of the position gap in all directions.

Further, in the display device of this embodiment 2, it is possible to perform the inspection and the determination immediately after the third lines 302A of the printed circuit board 3 and the second lines 202A of the film-like substrate 2 are connected with each other and, at the same time, it is possible to perform the inspection and the determination immediately after the first lines 101A of the display panel 1 and the second lines 202A of the film-like substrate 2 are connected with each other. Accordingly, when it is determined that the connection defect or the short-circuiting defect is generated in the respective connection steps, it is possible to correct the defects on sites. As a result, in inspecting the display operation of the display panel 1, it is possible to inspect the display panels 1 which are free from the connection defect or the short-circuiting defect and hence, the operability of the inspection of the display operation can be enhanced.

Further, by using the determination potential supply lines 302B or the position gap detection lines 302C of the printed circuit board 3 as the common line, it is possible to easily pull around the lines of the printed circuit board 3 and, at the same time, it is possible to inspect and determine the presence or the non-presence of the position gap for every film-like substrate 2.

Further, in this embodiment 2, the annular determination part is formed on the determination potential supply lines 202B of the film-like substrate 2. However, this embodiment 2 is not limited to such a constitution and an annular determination terminal which is arranged electrically independent from the determination potential supply lines 202B and is electrically connected with the printed circuit board 3 may be formed on the film-like substrate 2.

Further, in this embodiment 2, the explanation has been made with respect to the constitutional example in which one set of the determination potential supply lines 302B and the position gap detection lines 302C formed on the printed circuit board 3 are used for performing the inspection of the position gap between the third lines 302A and the second lines 202A as well as the inspection of the position gap between the first lines 101A and the second lines 202A. However, this embodiment 2 is not limited to such a constitutional example. That is, it may be possible to individually form determination potential supply lines and position gap detection terminals for performing the inspection of the position gap between the third lines 302A and the second lines 202A and determination potential supply lines and position gap detection lines for performing the inspection of the position gap between the first lines 101A and the second lines 202A on the printed circuit board 3.

Further, in this embodiment 2, although the display device which is configured on the premise of the constitution explained in conjunction with the embodiment 1 is taken as an example, this embodiment is not limited to such a constitutional example. For example, as explained in the embodiment 2, the display device may be configured to be capable of performing only the inspection and the determination of the position gap between the second lines 202A and the third lines 302A.

Embodiment 3

Figure 16:
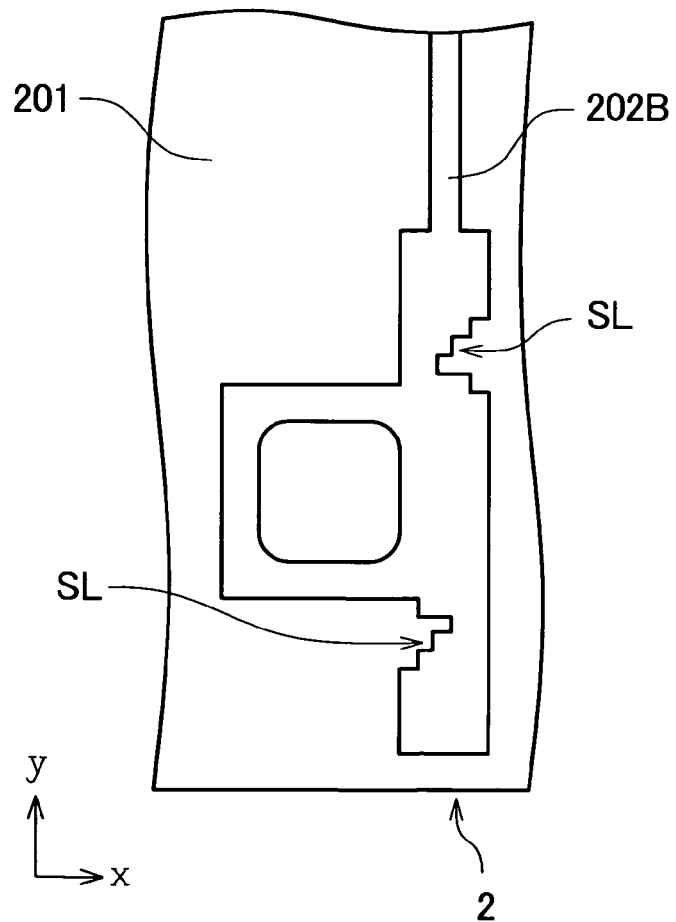
FIG. 16 is a schematic view showing the schematic constitution of the display device of the embodiment 3 according to the present invention, and also is a schematic view showing a constitutional example of the connection portion which connects a determination potential supply line which is arranged on the film-like substrate and the line of the printed circuit board.

FIG. 16 is a schematic view showing the schematic constitution of the display device of the embodiment 3 according to the present invention, and also is a schematic view showing a constitutional example of the connection portion which connects a determination potential supply line which is arranged on the film-like substrate and the line of the printed circuit board.

In the embodiment 2, the explanation has been made with respect to the constitutional example of the display device which facilitates the inspection and the determination of the presence or the non-presence of the position gap between the second lines 202A formed on the film substrate 2 and the third lines 302A formed on the printed circuit board 3 when the second lines 202A and the third lines 302A are electrically connected with each other. However, in inspecting and determining the presence or the non-presence of the position gap using a method explained in conjunction with the embodiment 2, it is necessary to form the position gap detection terminal P3 on the printed circuit board 3. Further, the connection portion between the second line 202A and the third line 302A has, in general, a larger line width compared to the connection portion between the first line 101A and the second line 202A as explained in conjunction with the embodiment 1 and hence, the connection portion possesses a wide allowable range with respect to the position gap. Accordingly, the possibility of the generation of the connection defect or the short-circuiting defect is relatively small.

Accordingly, in the embodiment 3, in place of performing the conduction inspection described in the embodiment 2, the explanation is made with respect to a method which can easily inspect and determine the presence or the non-presence of the position gap by performing an optical observation of the positional relationship between the second lines 202A and the third lines 302A.

Here, in this embodiment 3, the explanation is made with respect to a constitutional example of the display device which can easily inspect and determine the presence or the non-presence of the position gap when the second lines 202A and the third lines 302A are connected with each other on the premise of the constitutions explained in conjunction with the embodiment 1 and the embodiment 2.

Here, the basic constitutions of the display panel 1, the film substrate 2 and the printed circuit board 3 in the display device of this embodiment 3 may be substantially equal to the corresponding constitutions of the embodiment 1 and the embodiment 2 and hence, the detailed explanation of the basic constitutions is omitted. However, in this embodiment 3, to inspect and determine the position gap by observing the connection portion of lines, it is preferable that the third lines 302A of the printed circuit board 3 and the second lines 202A of the film substrate 2 are electrically connected with each other using a bonding material such as gold or solder.

In the display device of the embodiment 3, as shown in FIG. 16, step-like notches SL are formed in the determination potential supply line 202B which is formed on the film-like substrate 2. Here, the notches SL are formed on two opposing sides of the determination potential supply line 202B along the extending direction (y direction) of the determination potential supply line 202B in a state that one notch SL is formed on each side as shown in FIG. 16. Further, the steps in the x direction and the y direction of the notch SL may be set to proper values preliminarily. Further, the number of steps of the step-like notch SL is set to the number of steps which prevents the step-like notch SL from reaching the opposing other end portion. Further, two notches SL are formed in line symmetry in plane on the substrate.

Further, the determination potential supply lines 202B of the film substrate 2 may be provided with the annular determination part shown in FIG. 16, for example.

Figure 17:
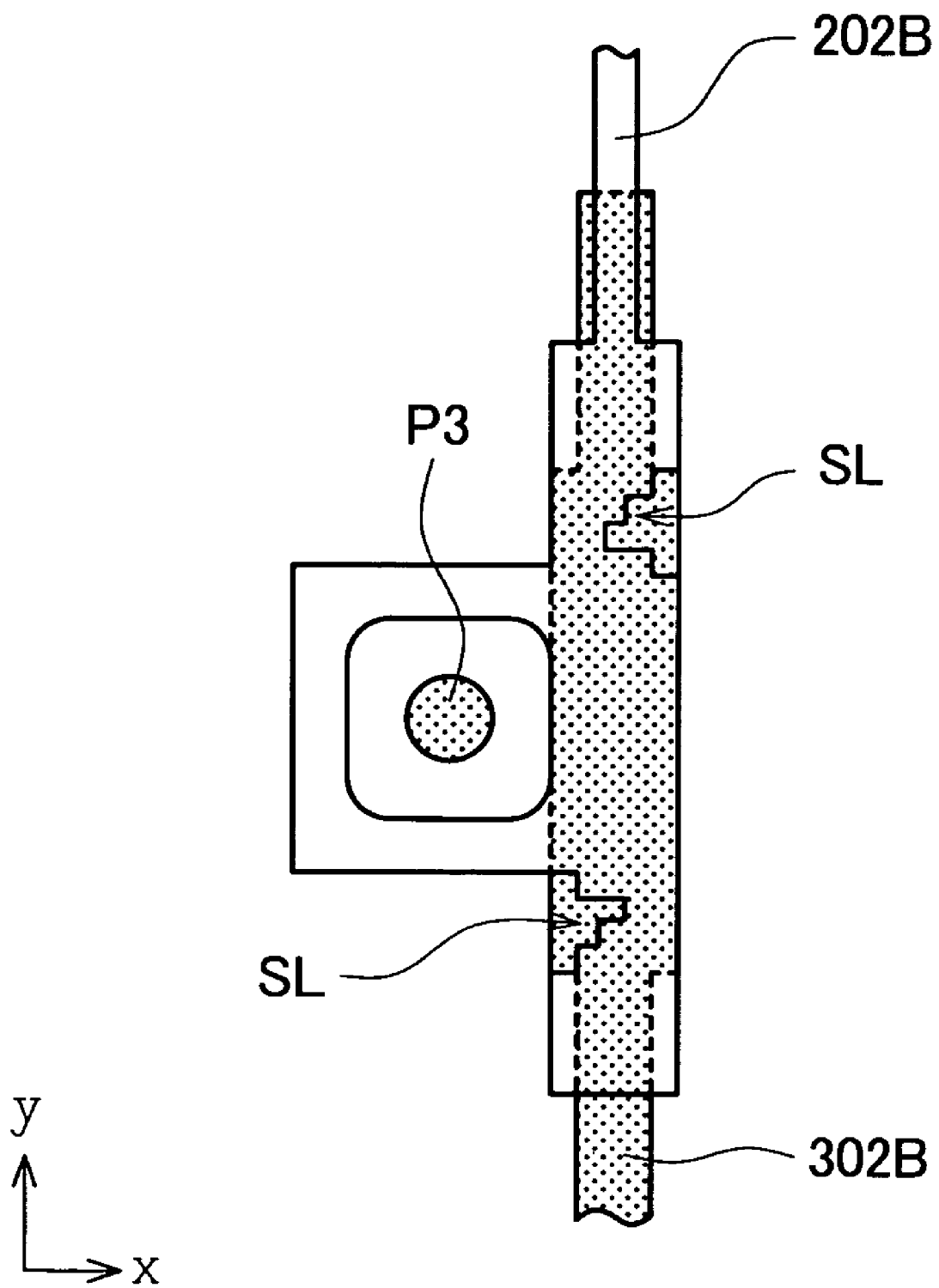
FIG. 17 is a schematic view for explaining an inspection and a determination method of the position gap of the display device of an embodiment 3, and also is a plan view showing a planner positional relationship between a second line and a third line which are correctly connected.
Figure 18:
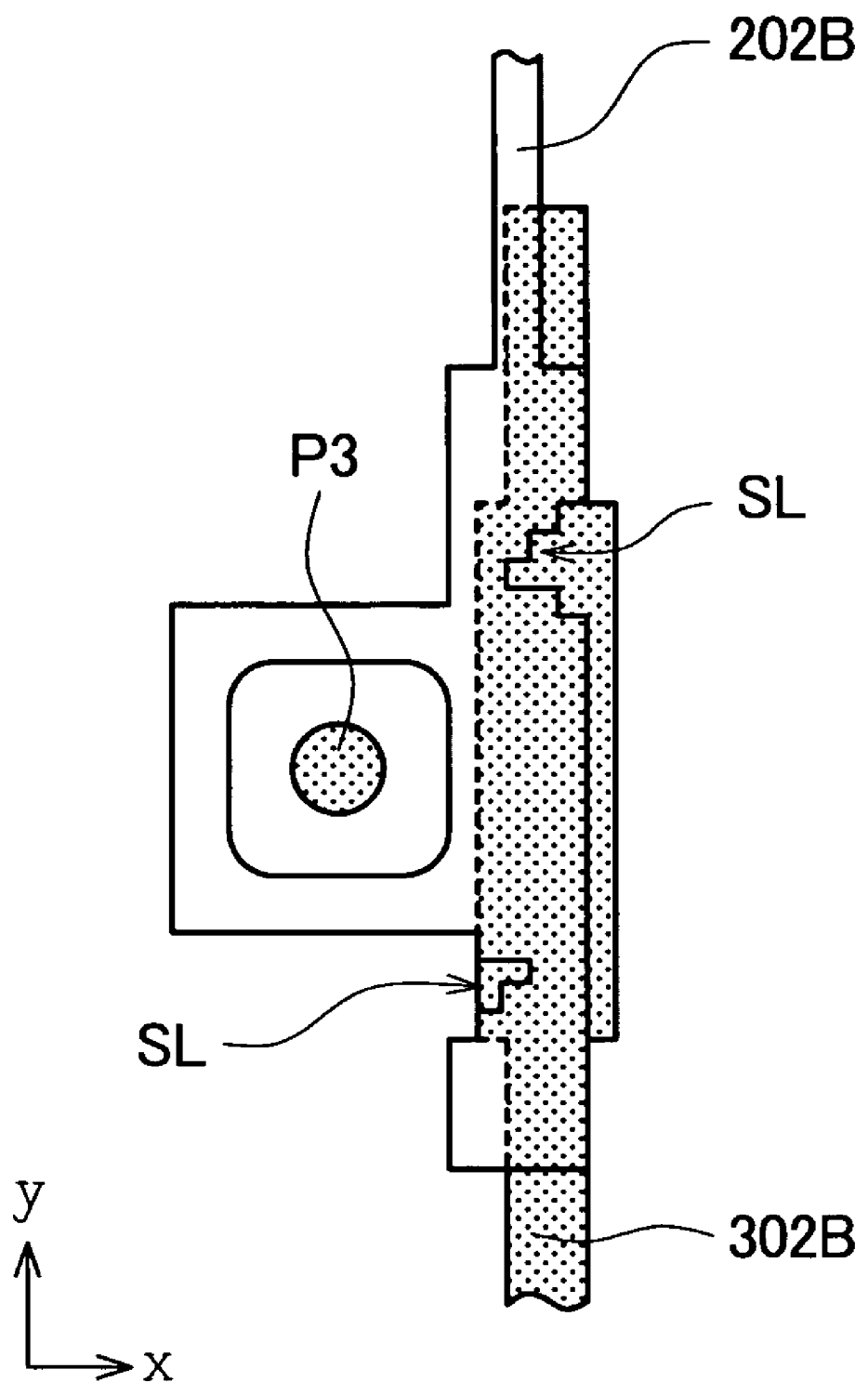
FIG. 18 is a schematic view for explaining the inspection and the determination method of the position gap of the display device of an embodiment 3, and also is a plan view showing a planner positional relationship between the second line and the third line when the position gap is generated.

FIG. 17 and FIG. 18 are schematic views for explaining an inspection and determination method of the position gap of the display device of the embodiment 3, wherein FIG. 17 is a plan view showing a planner positional relationship between the second line and the third line which are correctly connected, and FIG. 18 is a plan view showing a planner positional relationship between the second line and the third line when the position gap is generated.

In assembling the display device of the embodiment 3, in the same manner as the display devices of the embodiment 1 and the embodiment 2, for example, first of all, the third lines 302A of the printed circuit board 3 and the second lines 202A of the film substrate 2 are electrically connected with each other. Here, when the third lines 302A and the second lines 202A are accurately connected with each other, for example, as shown in FIG. 17, an end surface of the determination potential supply lines 302B of the printed circuit board 3 along the extending direction (y direction) of the determination potential supply lines 302B and an end surface of the determination potential supply lines 202B of the film substrate 2 along the extending direction (y direction) of the determination potential supply lines 202B are overlapped to each other in plane.

However, since a load is applied in electrically connecting the second lines 202A and the third lines 302A and hence, there exists a possibility that the position gap in the line width direction (x direction) may be generated, for example. Here, the connection portion between the determination potential supply lines 202B of the film substrate 2 and the determination potential supply lines 302B of the printed circuit board 3 assumes the positional relationship shown in FIG. 18, for example. Accordingly, when the position gap is generated at the connection portion between the determination potential supply lines 202B of the film substrate 2 and the determination potential supply lines 302B of the printed circuit board 3 based on the optical observation or the like, a step-like portion of the notch SL formed on the determination potential supply lines 202B of the film substrate 2 which the end surface of the third line 302A of the printed circuit board 3 along the extending direction (y direction) of the third line 302A passes is checked. Here, when the step of the step-like notch SL is known, it is possible to easily inspect a quantity and the direction of the position gap based on the position on which the end surface of the third line 302A of the printed circuit board 3 along the extending direction (y direction) of the third line 302A passes.

Further, in simply inspecting and determining the position gap in such a method, it is unnecessary to perform the conduction inspection of the embodiment 2 for inputting the determination potential and hence, the operability of the inspection of the position gap can be enhanced.

Further, in the constitution of the embodiment 3, by electrically connecting the second lines 202A of the film substrate 2 and the third lines 302A of the printed circuit board 3 using a bonding material, it is possible to perform the simple inspection and determination as described above. However, for example, when the second lines 202A and the third lines 302A are electrically connected with each other via the ACF 6, it is impossible to perform the above-mentioned simple inspection and determination as described above. Accordingly, when the second lines 202A and the third lines 302A are electrically connected with each other via the ACF 6, it is preferable to perform the inspection as explained in conjunction with the embodiment 2.

As has been explained above, according to the display device of the embodiment 3, by forming the step-like notches SL in the connection portion between the determination potential supply line 202B of the film substrate 2 and the determination potential supply line 302B of the printed circuit board 3, it is possible to simply inspect and determine the presence or the non-presence of the position gap when the second lines 202A and the third lines 302A are connected with each other.

Further, in the embodiment 3, the display device which is formed on the premise of the constitutions explained in conjunction with the embodiment 1 and the embodiment 2 is taken as an example. However, the embodiment 3 is not limited to such a display device. For example, it is possible to provide the display device which enables only the simple inspection and the determination of the position gap between the second lines 202A and the third lines 302A as explained in conjunction with the embodiment 3

Although the present invention has been specifically explained in conjunction with the embodiments, it is needless to say that the present invention is not limited to the above-mentioned embodiments and various modifications can be made without departing from the gist of the present invention.

For example, in the embodiments 1 to 3, the liquid crystal display panel is exemplified as the display panel 1. However, the display panel 1 is not limited to the liquid crystal display panel and provided that the display panel 1 is a display panel which forms lines for image display on a substrate, it is possible to obtain the substantially same advantageous effects by adopting the constitutions described in the embodiment 1 to the embodiment 3.

What is claimed is:

1. A display device comprising:
a display panel which forms a plurality of lines as first lines on a terminal portion thereof; and
a film-like substrate which forms a plurality of lines as second lines thereon, wherein
the display panel has a determination terminal which is arranged close to the terminal portion, has a width larger than a width of the second line, and has a removed portion where a part of the terminal portion is removed,
the film-like substrate forms third lines and fourth lines arranged close to the second lines thereon,
a width of the fourth line is wider at the end portion than other area,
the determination terminal has a form of non-continuous ring-like shape enclosing the removed portion,
the third lines face the determination terminal in an opposed manner, and
the fourth lines face the removed portion of the determination terminal from which the portion is removed.

2. A display device according to claim 1, wherein when the fourth line is displaced exceeding the removed portion of the determination terminal, the third line and the fourth line assume the same potential thus detecting a position gap.

3. A display device according to claim 1, wherein a removed shape of the determination terminal is configured to be capable of determining respective position gaps in both directions along which the plurality of first lines are arranged in parallel and in both directions which are perpendicular to the elongated direction of the first line.

4. A display device according to claim 1, wherein the third lines and the fourth lines are electrically connected with lines formed on a printed circuit board.

5. A display device according to claim 2, wherein a removed shape of the determination terminal is configured to be capable of determining respective position gaps in both directions along which the plurality of first lines are arranged in parallel and in both directions which is perpendicular to the elongated direction of the first line.

6. A display device according to claim 2, wherein the third lines and the fourth lines are electrically connected with lines formed on a printed circuit board.

7. A display device according to claim 3, wherein the third lines and the fourth lines are electrically connected with lines formed on a printed circuit board.

8. A display device according to claim 5, wherein the third lines and the fourth lines are electrically connected with lines formed on a printed circuit board.

* * * * *

UNITED STATES PATENT AND TRADEMARK OFFICE
CERTIFICATE OF CORRECTION

PATENT NO.       : 7,646,464 B2                                Page 1 of 1
APPLICATION NO.  : 11/451348
DATED            : January 12, 2010
INVENTOR(S)      : Yuuichi Takenaka It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 859 days.

Signed and Sealed this

Sixteenth Day of November, 2010

David J. Kappos
*Director of the United States Patent and Trademark Office*